(12) United States Patent
Hwang et al.

(10) Patent No.: US 12,205,977 B2
(45) Date of Patent: Jan. 21, 2025

(54) DISPLAY MODULE, DISPLAY APPARATUS AND METHOD FOR MANUFACTURING THE SAME

(71) Applicant: SAMSUNG ELECTRONICS CO., LTD., Suwon-si (KR)

(72) Inventors: Daesuck Hwang, Suwon-si (KR); Kyungwoon Jang, Suwon-si (KR); Changkyu Chung, Suwon-si (KR); Gyun Heo, Suwon-si (KR); Soonmin Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 466 days.

(21) Appl. No.: 17/524,421

(22) Filed: Nov. 11, 2021

(65) Prior Publication Data

US 2022/0149112 A1 May 12, 2022

Related U.S. Application Data

(63) Continuation of application No. PCT/KR2021/015741, filed on Nov. 2, 2021.

(30) Foreign Application Priority Data

Nov. 6, 2020 (KR) .......................... 10-2020-0147550

(51) Int. Cl.
*H01L 27/15* (2006.01)
*G09G 3/32* (2016.01)
(Continued)

(52) U.S. Cl.
CPC ............. *H01L 27/156* (2013.01); *G09G 3/32* (2013.01); *H01L 33/005* (2013.01); *G09G 2300/0426* (2013.01); *H01L 25/167* (2013.01)

(58) Field of Classification Search
CPC ...... H01L 27/153; H01L 27/156; H01L 33/36; H01L 33/38; H01L 33/382; H01L 33/387;
(Continued)

(56) References Cited

U.S. PATENT DOCUMENTS 11,282,820 B2 * 3/2022 Takeya ................... H01L 33/38
11,514,859 B2 * 11/2022 Jang ....................... H10K 59/18
(Continued)

FOREIGN PATENT DOCUMENTS

KR 10-2018-0118090 A 10/2018
KR 10-2018-0118488 A 10/2018
(Continued)

OTHER PUBLICATIONS

International Search Report (PCT/ISA/210) issued Feb. 23, 2022 by the International Searching Authority in International Application No. PCT/KR2021/015741.
(Continued)

*Primary Examiner* — Nicholas J Tobergte
*Assistant Examiner* — Illiam Henry Anderson
(74) *Attorney, Agent, or Firm* — Sughrue Mion, PLLC

(57) ABSTRACT

A display module and a display apparatus including the same are provided. The display module includes a first substrate; a plurality of micro-pixel controllers provided on an upper surface of the first substrate and including a second substrate; a plurality of pixels including a plurality of inorganic light emitting diodes (LEDs) provided on an upper surface of the second substrate; and a driver integrated chip (IC) configured to transmit a driving signal to the plurality of micro-pixel controllers, wherein each pixel of the plurality of pixels includes at least two inorganic LEDs among the plurality of inorganic LEDs, and wherein each micro-pixel controller of the plurality of micro-pixel controllers is electrically connected to inorganic LEDs of at least two pixels.

13 Claims, 25 Drawing Sheets

(51) Int. Cl.
*H01L 33/00* (2010.01)
*H01L 25/16* (2023.01)

(58) Field of Classification Search
CPC ............. H01L 33/48–486; H01L 33/62; H01L 25/075–0756; H01L 25/13
See application file for complete search history.

(56) References Cited

U.S. PATENT DOCUMENTS

| | | | |
|---|---|---|---|
| 2014/0027709 A1 | 1/2014 | Higginson et al. | |
| 2015/0169011 A1 | 6/2015 | Bibl et al. | |
| 2015/0373793 A1* | 12/2015 | Bower | H01L 33/58 362/20 |
| 2017/0256522 A1* | 9/2017 | Cok | H01L 25/50 |
| 2018/0190184 A1* | 7/2018 | Kim | G09G 3/32 |
| 2018/0211945 A1 | 7/2018 | Cok et al. | |
| 2018/0308420 A1 | 10/2018 | Shin et al. | |
| 2019/0096864 A1 | 3/2019 | Huitema et al. | |
| 2019/0123235 A1 | 4/2019 | Cho et al. | |
| 2019/0287949 A1 | 9/2019 | Chong et al. | |
| 2020/0020676 A1 | 1/2020 | Cok et al. | |
| 2020/0312904 A1* | 10/2020 | Hin | H01L 33/62 |
| 2020/0350476 A1 | 11/2020 | Lee et al. | |
| 2021/0217353 A1* | 7/2021 | Zhao | G09G 3/3266 |
| 2022/0399380 A1* | 12/2022 | Ito | H01L 25/0753 |

FOREIGN PATENT DOCUMENTS

| | | |
|---|---|---|
| KR | 10-2019-0044492 A | 4/2019 |
| KR | 10-2019-0123426 A | 11/2019 |
| KR | 10-2019-0127872 A | 11/2019 |

OTHER PUBLICATIONS

Communication dated Apr. 3, 2023, issued by the European Patent Office in European Patent Application No. 21889532.4.
Communication dated Jun. 28, 2023, issued by the European Patent Office in European Patent Application No. 21889532.4.

* cited by examiner

DISPLAY MODULE, DISPLAY APPARATUS AND METHOD FOR MANUFACTURING THE SAME

CROSS-REFERENCE TO RELATED APPLICATION(S)

This application is a by-pass continuation of International PCT Application No. PCT/KR2021/015741 filed Nov. 2, 2021, which is based on and claims priority to Korean Patent Application No. 10-2020-0147550, filed Nov. 6, 2020 in the Korean Intellectual Property Office, the disclosures of which are incorporated by reference herein in their entireties.

BACKGROUND

1. Field

The present disclosure relates to a display module configured to realize an image using an inorganic light emitting diode, a display apparatus, and a method for manufacturing the same.

2. Description of Related Art

A display apparatus may be classified into a self-luminous display in which each pixel emits light and a non-self-luminous display that requires a separate light source.

A Liquid Crystal Display (LCD) is a non-self-luminous display, and needs a backlight unit configured to supply light from the rear of a display panel, a liquid crystal layer configured to serve as a switch to transmit/block the light from the rear of the display panel, and a color filter configured to change the supplied light to a desired color. Therefore, it leads to complexity in the structure and there is a limitation in implementing a display with a small thickness.

On the other hand, the self-luminous display, in which each pixel emits light by itself by including a light-emitting diode (LED) for each pixel, does not need components, such as a backlight unit, a liquid crystal layer, and a color filter. Therefore, the self-luminous display has a relatively simple structure and a high degree of freedom in the design. Further, it is possible to realize a small thickness with better contrast, higher brightness and wider viewing angle.

A micro-LED display in the self-luminous display is one of the flat-panel displays and is composed of a plurality of light emitting diodes (LEDs) having a size of 100 micrometers or less. In comparison with liquid crystal display panels that require a backlight, the micro-LED display panels provide better contrast, response time and energy efficiency.

The micro-LED, that is, an inorganic light emitting diode, has higher brightness, better light emission efficiency, and longer life compared to an organic light emitting diode (OLED) that needs a separate encapsulation layer for protecting organic materials.

SUMMARY

The present disclosure is directed to providing a display module, a display apparatus and a method for manufacturing the display module capable of providing a narrow pitch interval and a wide viewing angle by mounting a substrate, in which a thin film transistor circuit is provided and an inorganic light emitting diode is mounted on an upper surface of the substrate, to a module substrate, and capable of further facilitating circuit inspection and replacement and manufacturing process.

In accordance with an aspect of the disclosure, there is provided a display module including: a first substrate; a plurality of micro-pixel controllers provided on an upper surface of the first substrate and including a second substrate; a plurality of pixels including a plurality of inorganic light emitting diodes (LEDs) provided on an upper surface of the second substrate; and a driver integrated chip (IC) configured to transmit a driving signal to the plurality of micro-pixel controllers, wherein each pixel of the plurality of pixels includes at least two inorganic LEDs among the plurality of inorganic LEDs, and wherein each micro-pixel controller of the plurality of micro-pixel controllers is electrically connected to inorganic LEDs of at least two pixels.

Each micro-pixel controller of the plurality of micro-pixel controllers is configured to switch the inorganic LEDs of the at least two pixels, and supply a driving current to the inorganic LEDs of the at least two pixels.

Each micro-pixel controller of the plurality of micro-pixel controllers includes: an upper connection pad provided on the upper surface of the second substrate and electrically connected to at least one of the inorganic LEDs; at least one thin film transistor (TFT) provided on the second substrate and electrically connected to the upper connection pad through a blind via; and a lower connection pad provided on a lower surface of the second substrate, electrically connected to the at least one TFT through the blind via, and electrically connected to an upper wiring pad of the first substrate.

The upper connection pad includes a cathode pad electrically connected to a cathode of the inorganic LED, and the cathode pad is electrically connected to the lower connection pad through a via hole, and is supplied with a reference voltage through the first substrate.

The first substrate includes an upper wiring that is connected to the driver IC to transmit the driving signal.

Each micro-pixel controller of the plurality of micro-pixel controllers is electrically connected to the upper wiring through the upper wiring pad, and configured to receive the driving signal output from the driver IC through the upper wiring.

Pixels adjacent to each other among the plurality of pixels are spaced apart from each other at a predetermined interval.

An interval between two or more pixels arranged on a second substrate of a first micro-pixel controller is equal to an interval between a first pixel arranged on the second substrate of the first micro-pixel controller and a second pixel adjacent to the first pixel and arranged on a second substrate of a second micro-pixel controller adjacent to the first micro-pixel controller.

The second substrate includes a silicon substrate.

Each pixel of the plurality of pixels includes at least three sub-pixels that output light of different colors.

In accordance with an aspect of the disclosure, there is provided a display apparatus including: a plurality of display modules; and a frame configured to support the plurality of display modules, wherein each display module of the plurality of display modules includes: a first substrate; a plurality of micro-pixel controllers arranged on an upper surface of the first substrate and including a second substrate; a plurality of pixels arranged in two dimensions and including a plurality of inorganic light emitting diodes (LEDs) arranged on an upper surface of the second substrate; and a driver integrated chip (IC) configured to transmit a driving signal to the plurality of micro-pixel controllers, wherein each pixel of the plurality of pixels includes at least two LEDs among the plurality of inorganic LEDs, and wherein each micro-pixel controller of the plurality of micro-pixel controllers is electrically connected to inorganic LEDs of at least two pixels.

Each micro-pixel controller of the plurality of micro-pixel controllers is configured to switch the inorganic LEDs of the at least pixels, and supply a driving current to the inorganic LEDs of the at least two pixels.

Each micro-pixel controller of the plurality of micro-pixel controllers includes: an upper connection pad arranged on the upper surface of the second substrate and electrically connected to at least one of the plurality of inorganic LEDs; at least one thin film transistor (TFT) arranged on the second substrate and electrically connected to the upper connection pad through a blind via; and a lower connection pad arranged on a lower surface of the second substrate, electrically connected to the at least one TFT through the blind via, and electrically connected to an upper wiring pad of the first substrate.

The upper connection pad includes a cathode pad electrically connected to a cathode of the inorganic LED, and the cathode pad is electrically connected to the lower connection pad through a via hole, and is supplied with a reference voltage through the first substrate.

The first substrate includes an upper wiring that is connected to the driver IC to transmit the driving signal.

The display apparatus may further include a driving board configured to transmit a timing control signal to the plurality of display modules, and the driving board may be arranged on a lower side of the frame and electrically connected to the plurality of display modules through an open area of the frame.

In accordance with various embodiments of the present disclosure, it is possible to provide a narrow pitch interval and a wide viewing angle by mounting a substrate, in which a thin film transistor circuit is provided and an inorganic light emitting diode is mounted on an upper surface of the substrate, to a module substrate, and it is possible to facilitate circuit inspection and replacement and manufacturing process.

BRIEF DESCRIPTION OF THE DRAWINGS

The above and other aspects, features, and advantages of certain embodiments of the present disclosure will be more apparent from the following description taken in conjunction with the accompanying drawings.

DETAILED DESCRIPTION

Figure 1:
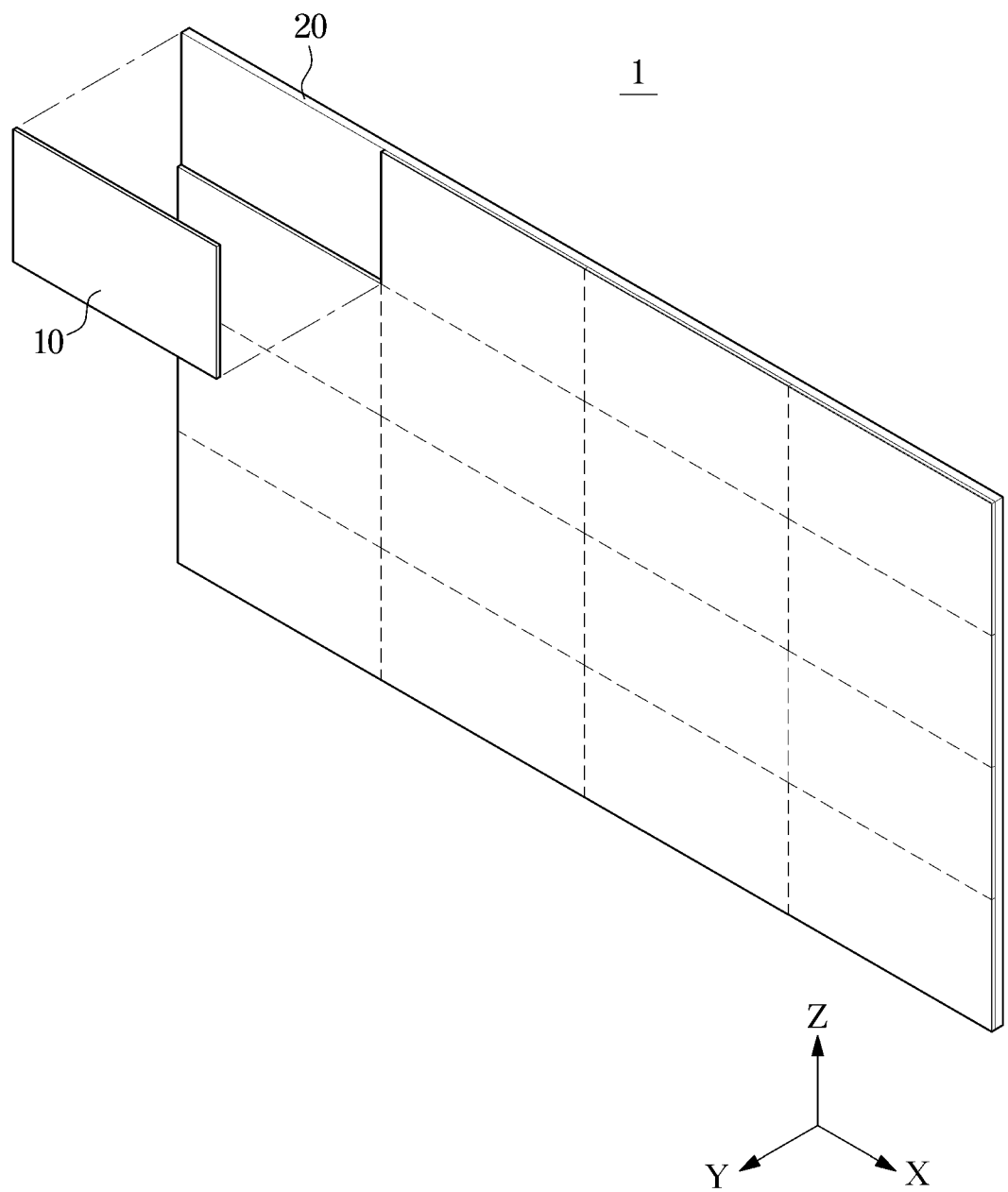
FIG. 1 is a perspective view illustrating an example of a display apparatus including a display module according to an embodiment.

Embodiments described in the disclosure and configurations shown in the drawings are merely examples, and may be modified in various ways to replace the embodiments and drawings of the disclosure.

It will be understood that when an element is referred to as being "connected" to another element, it can be directly or indirectly connected to the other element, wherein the indirect connection includes "connection via a wireless communication network" or "electrical connection through an electrical wiring".

Also, the terms used herein are used to describe the embodiments and are not intended to limit and/or restrict the scope of the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms "first", "second", "third", etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

In the following description, terms such as "unit", "part", "block", "member", and "module" indicate a unit for processing at least one function or operation. For example, those terms may refer to at least one process processed by at least one hardware such as Field Programmable Gate Array (FPGA), Application Specific Integrated Circuit (ASIC), at least one software stored in a memory or a processor.

An identification code is used for the convenience of the description but is not intended to illustrate the order of each step. Each step may be implemented in the order different from the illustrated order unless the context clearly indicates otherwise.

Hereinafter, example embodiments of the present disclosure will be described in detail with reference to the accompanying drawings.

Figure 2:
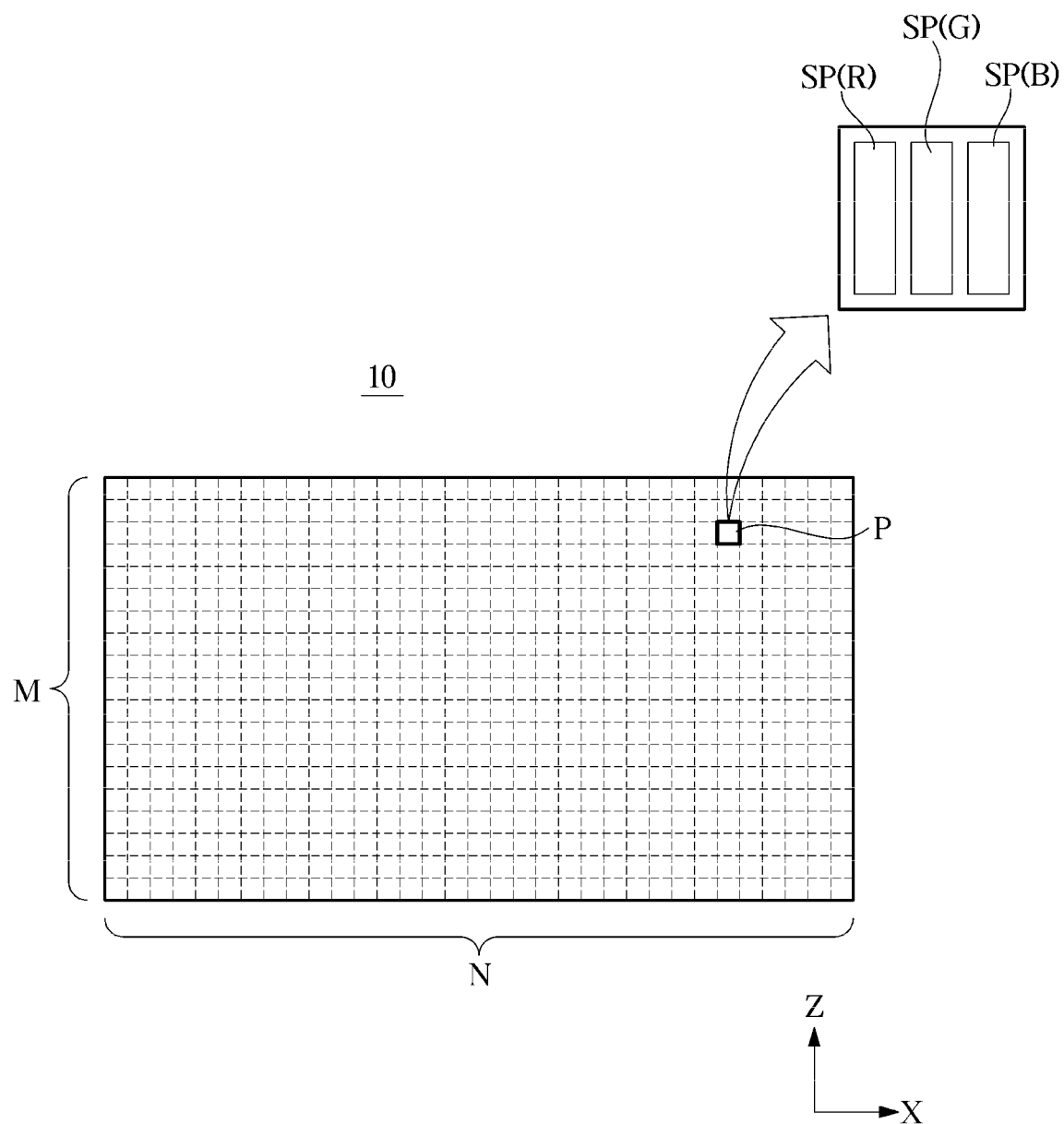
FIG. 2 is a view illustrating an example of a pixel array constituting a unit module of a display apparatus according to an embodiment.

FIG. 1 is a perspective view illustrating an example of a display apparatus including a display module according to an embodiment, and FIG. 2 is a view illustrating an example of a pixel array constituting a unit module of a display apparatus according to an embodiment.

A display apparatus 1 according to an embodiment of the present disclosure is a self-luminous display apparatus in which a light emitting element is disposed for each pixel to allow each pixel to emit light by itself. Unlike an LCD apparatus, because a component, such as a backlight unit and a liquid crystal layer, is not used, it is possible to realize a small thickness and a simpler structure. Therefore, a design may vary in a variety of ways.

In addition, the display apparatus 1 according to an embodiment of the present disclosure may implement an inorganic light emitting element, such as an inorganic light emitting diode (LED), as a light emitting element disposed in each pixel. The inorganic light emitting element may have a fast reaction speed and realize high luminance with low power in comparison with an organic light emitting element, such as an organic light emitting diode (OLED).

In addition, in comparison with the organic light emitting element that requires an encapsulation process, because the organic light emitting element is vulnerable to exposure to water and oxygen, and has poor durability, the inorganic light emitting element may not require the encapsulation process and have better durability. Hereinafter an inorganic light emitting element illustrated in an embodiment described below represents an inorganic light emitting diode (LED).

The inorganic LED in the display apparatus 1 may be a micro-LED having a short side length of about 100 µm. As described above, by using the micro-unit LED, it is possible to reduce the pixel size and realize high resolution with the same size screen.

In addition, if an LED chip is manufactured at the size of a micro unit, it is possible to prevent the LED chip being cracked due to characteristics of inorganic materials when a substrate on which the LED chip is placed is bent. That is, when an LED chip is transferred to a flexible substrate, the LED chip may be easily cracked or become defective if the substrate is bent. However, when a micro-LED chip is transferred to a flexible substrate, the micro-LED chip may be sustainable on the flexible substrate due to its small size and self-emitting characteristics. Accordingly, it is possible to implement a flexible display apparatus using micro-LED chips.

A display apparatus including a micro-LED may be applied to various fields due to a small pixel size and a thin thickness. For example, as shown in FIG. 1, a large-size screen may be implemented by tiling a plurality of display modules 10, to which a plurality of micro-LEDs is transferred, and by fixing the plurality of display modules 10 to a housing 20. The display apparatus provided with the large-size screen may be used as a signage, an electric billboard, and the like.

The three-dimensional coordinate system of the X-Y-Z axis shown in FIG. 1 is based on the display apparatus 1, and a plane on which a screen of the display apparatus 1 is positioned is a X-Z plane, and a direction in which an image is output or a direction in which the inorganic LED emits light is the +Y-axis direction. Because the coordinate system is based on the display apparatus 1, the same coordinate system may be applied to both a state in which the display apparatus 1 lies down and a state in which the display apparatus 1 is upright.

In general, the display apparatus 1 is used in an upright state, and a user views an image from the front of the display apparatus 1. Therefore, the +Y-axis direction in which the image is output may be referred to as the front, and the opposite direction may be referred to as the rear.

Further, the display apparatus 1 is typically manufactured in a lying-down state. Accordingly, the −Y-axis direction of the display apparatus 1 may be referred to as a lower direction, and the +Y-axis direction may be referred to as an upper direction. That is, in one embodiment to be described later, the +Y-axis direction may be referred to as an upper direction or a front direction, and the −Y-axis direction may be referred to as a lower direction or a rear direction.

Except for the upper and lower surfaces of the flat panel display apparatus 1 or the display module 10, the remaining four surfaces may be referred to as side surfaces regardless of the posture of the display apparatus 1 or the display module 10.

In FIG. 1, the display apparatus 1 includes a plurality of display modules to form a large-size screen, but the embodiment of the display apparatus 1 is not limited thereto. By including a single display module 10, the display apparatus 1 may be implemented as a TV, a wearable device, a portable device, a PC monitor, etc.

Referring to FIG. 2, the display module 10 may include an M×N (M and N are two or more integers) array of pixels, that is, a plurality of pixels arranged in two dimensions. FIG. 2 conceptually illustrates a pixel arrangement, and it should be understood that, as well as an active region in which the pixels are arranged, a bezel region or a wiring region, on which an image is not displayed, is located in the display module 10.

In the embodiment, certain components that are arranged in two dimensions may not only include components are arranged on the same plane, but also include components that are arranged on different planes parallel to each other. In addition, the corresponding components that are arranged on the same plane may not only include an upper end of the corresponding components that are arranged on the same plane, but also include an upper end of the corresponding components are arranged on different planes parallel to each other.

The unit pixel P may include at least three sub-pixels configured to output light of different colors. For example, the unit pixel P may include three sub-pixels SP(R), SP(G), and SP(B) corresponding to R, G, and B, respectively. The red sub-pixel SP(R) may output red light, the green sub-pixel SP(G) may output green light, and the blue sub-pixel SP(B) may output blue light.

However, the pixel arrangement of FIG. 2 is only an example. In another example, the sub-pixels may be arranged along the Z-axis direction, arranged non-linearly, and have different sizes of the sub-pixels. As long as a single pixel includes a plurality of sub-pixels to implement a plurality of colors, the size or arrangement of each sub-pixel may vary.

In addition, it is not necessary that the unit pixel P is composed of the red sub-pixel SP(R) outputting red light, the green sub-pixel SP(G) outputting green light, and the blue sub-pixel SP(B) outputting blue light, and thus the unit pixel P may include a sub-pixel outputting yellow light or a sub-pixel outputting white light. That is, the color or type of light output from each sub-pixel and the number of sub-pixels may vary.

However, in one embodiment to be described later, an example in which the unit pixel P includes a red sub-pixel SP(R), a green sub-pixel SP(G), and a blue sub-pixel SP(B) will be described for a detailed description.

As mentioned above, the display apparatus 1 according to an embodiment may be a self-luminous display apparatus in which each pixel emits light by itself. Accordingly, an inorganic LED emitting different colors of light may be disposed in each sub-pixel. For example, a red LED may be disposed in the red sub-pixel SP(R), a green inorganic LED may be disposed in the green sub-pixel SP(G), and a blue inorganic LED may be disposed in the blue sub-pixel SP(B).

Accordingly, in the embodiment, the pixel P may represent a cluster including a red inorganic LED, a green inorganic LED, and a blue inorganic LED, and a sub-pixel may represent each inorganic LED.

Figure 3:
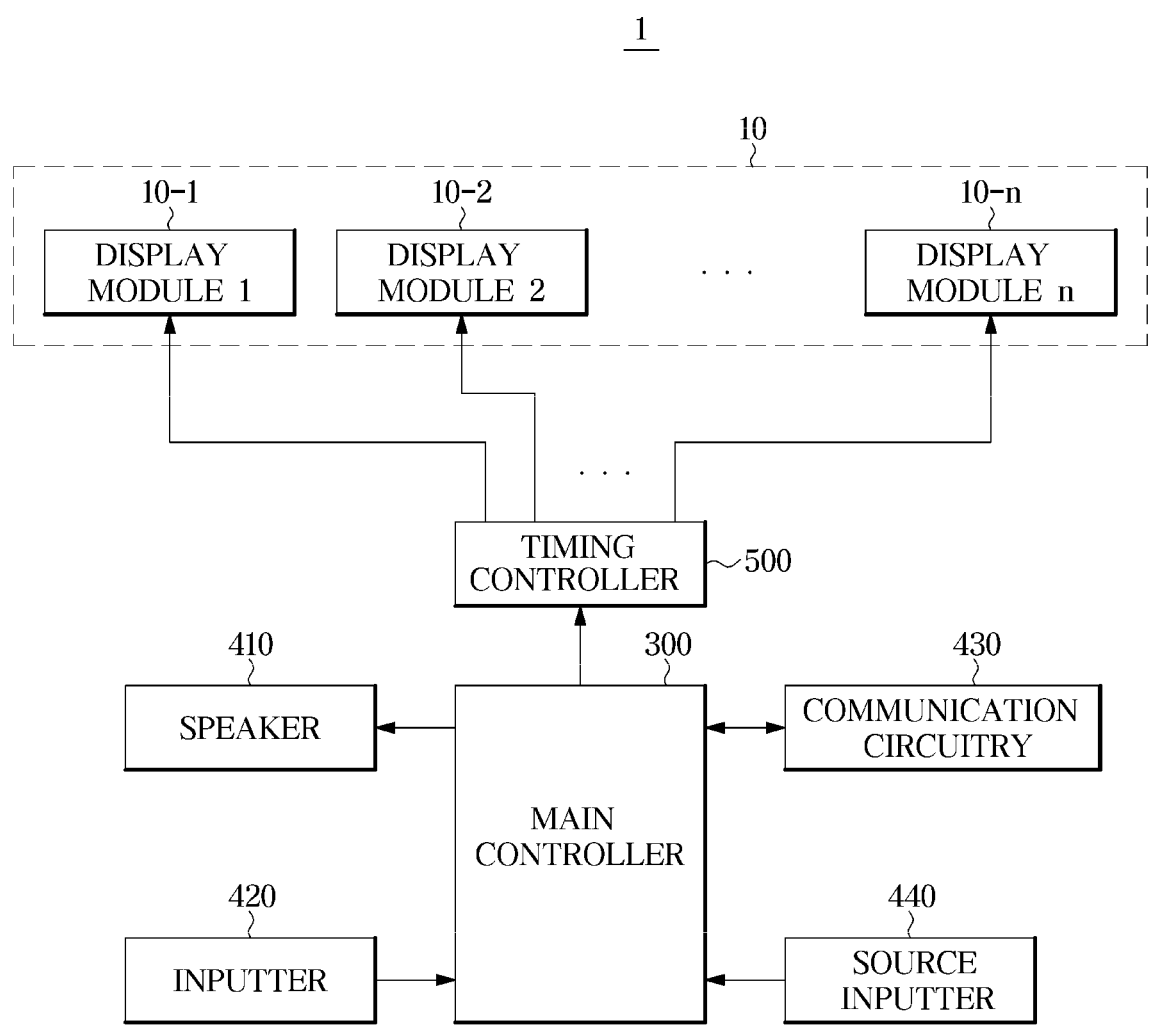
FIG. 3 is a control block diagram of a display apparatus according to an embodiment.

FIG. 3 is a control block diagram of the display apparatus 1 according to an embodiment.

As described above with reference to FIG. 1, the display apparatus 1 according to one embodiment may include a plurality of display modules 10-1, 10-2, . . . , 10-n, (n is a positive integer greater than or equal to 2). The display apparatus 1 may include a main controller 300 and a timing controller 500 configured to control the plurality of display modules 10, a communication circuitry 430 configured to communicate with an external device, a source inputter 440 configured to receive a source image, a speaker 410 configured to output sound, and an inputter 420 configured to receive a command for controlling the display apparatus 1 from a user.

The inputter 420 may include a button or a touch pad provided in one region of the display apparatus 1, and when a display panel 100 (refer to FIG. 4) is implemented as a touch screen, the inputter 420 may include a touch pad installed on a front surface of the display panel 100. Alternatively, the inputter 420 may include a remote controller.

The inputter 420 may receive various commands for controlling the display apparatus 1, such as power on/off, volume adjustment, channel adjustment, screen adjustment, and various settings change of the display apparatus 1 from the user.

The speaker 410 may be provided in one region of the housing 20, or a separate speaker module physically separated from the housing 20 may be further provided.

The communication circuitry 430 may communicate with a relay server or other electronic device to exchange necessary data. The communication circuitry 430 may employ at least one of wireless communication technologies, such as 3Generation (3G), 4Generation (4G), wireless LAN, Wi-Fi, Bluetooth, Zigbee, Wi-Fi Direct (WFD), Ultra-wideband (UWB), Infrared Data Association (IrDA), Bluetooth Low Energy (BLE), near field communication (NFC), and Z-Wave. In addition, the communication circuitry 430 may employ a wired communication method, such as Peripheral Component Interconnect (PCI), PCI-express, or Universal Serial Bus (USB).

The source inputter 440 may receive a source signal input from a set-top box, USB, antenna, or the like. Accordingly, the source inputter 440 may include at least one selected from a group of source input interfaces including an HDMI cable port, a USB port, and an antenna.

A source signal received by the source inputter 440 may be processed by the main controller 300 and converted into a form that can be output by the display panel 100 and the speaker 410.

The main controller 300 and the timing controller 500 may include at least one memory configured to store a program and various data for performing an operation to be described later, and at least one processor configured to execute the stored program.

The main controller 300 may process a source signal input through the source inputter 440 to generate an image signal corresponding to the input source signal.

For example, the main controller 300 may include a source decoder, a scaler, an image enhancer, and a graphic processor. The source decoder may decode a source signal compressed in a format such as MPEG, and the scaler may output image data of a desired resolution through resolution conversion.

The image enhancer may improve the image quality of image data by applying various techniques of correction. The graphic processor may classify pixels of image data into RGB data and output the RGB data together with a control signal such as a syncing signal for display timing in the display panel 100. That is, the main controller 300 may output image data and a control signal corresponding to the source signal.

The above-described operation of the main controller 300 is only an example of the display apparatus 1, and the main controller 300 may further perform other operations or may omit some or all of the above-described operations.

Image data and control signals output from the main controller 300 may be transmitted to the timing controller 500.

The timing controller 500 may convert the image data transmitted from the main controller 300 into image data in a form that can be processed by a driver integrated circuit (IC) 200 (refer to FIG. 4), and the timing controller 500 may generate various control signals, such as a timing control signal, required for displaying the image data on the display panel 100.

Figure 4:
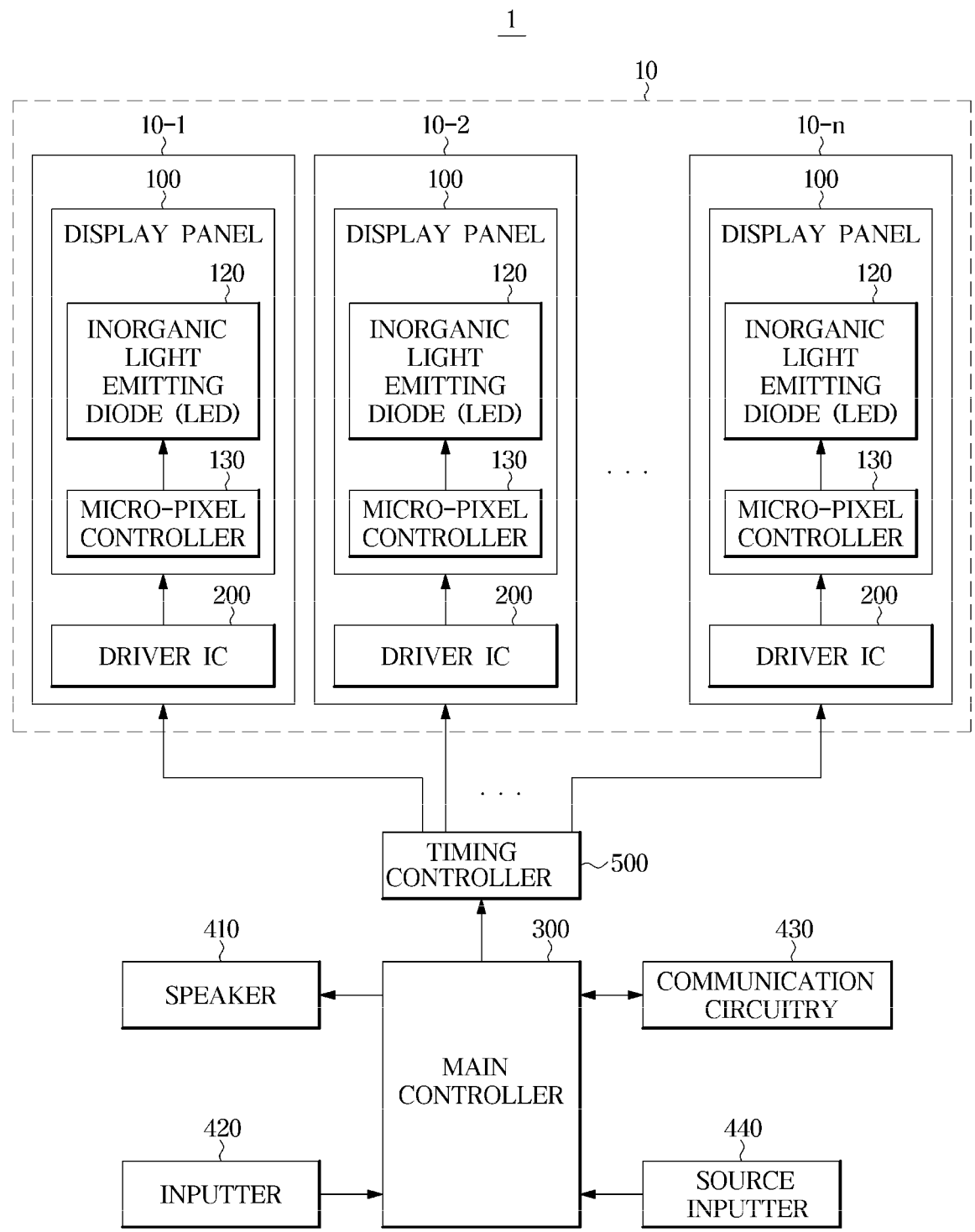
FIG. 4 is a control block diagram illustrating a display module in a display apparatus according to an embodiment.
Figure 5:
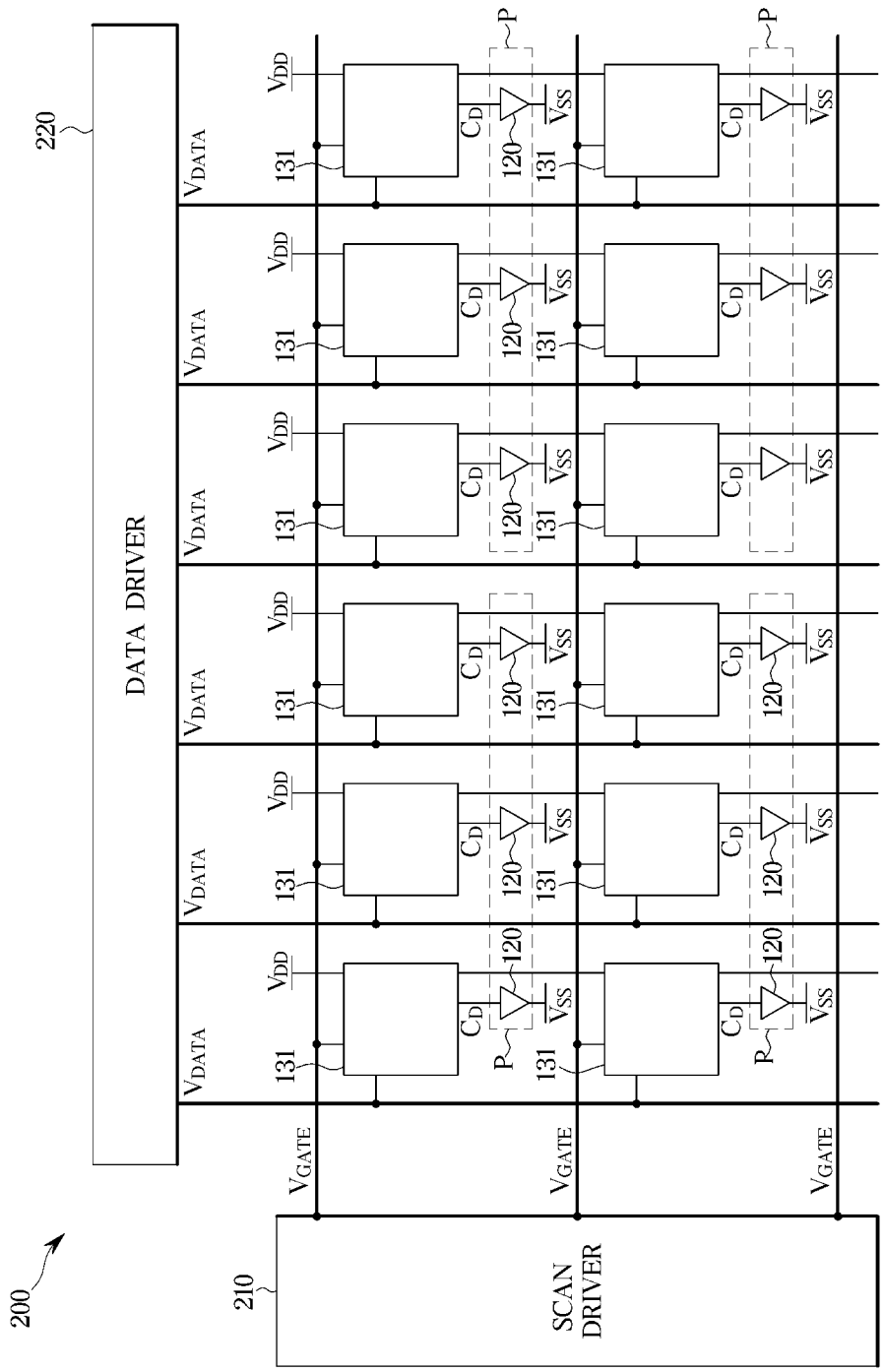
FIG. 5 is a view schematically illustrating a circuit in which each pixel is driven in a display module according to an embodiment.
Figure 6:
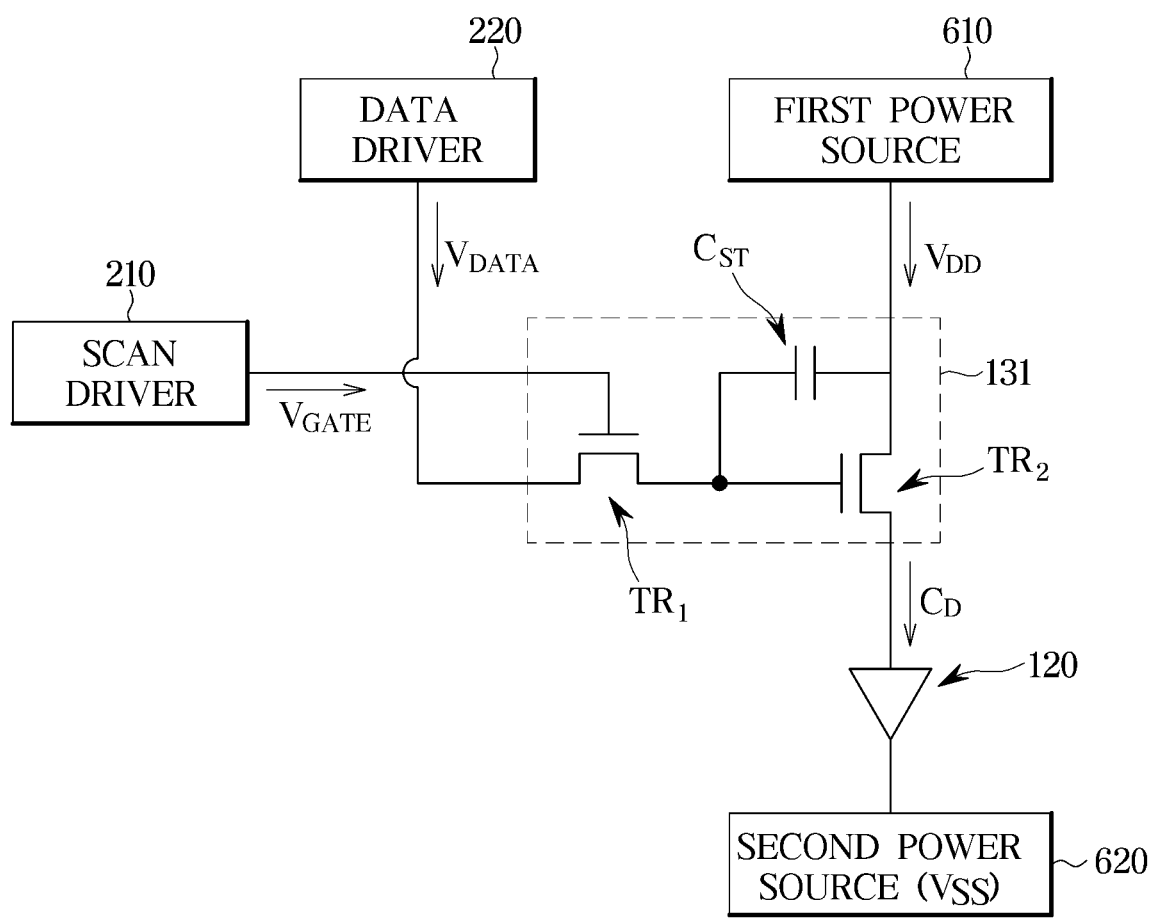
FIG. 6 is a circuit diagram schematically illustrating a pixel circuit controlling a single sub-pixel in a display module according to an embodiment.

FIG. 4 is a control block diagram illustrating the display module 10 in the display apparatus 1 according to an embodiment, FIG. 5 is a view schematically illustrating a circuit in which each pixel is driven in the display module 10 according to an embodiment, and FIG. 6 is a circuit diagram briefly illustrating a pixel circuit controlling a single sub-pixel in the display module 10 according to an embodiment.

Referring to FIG. 4, each of the plurality of display modules 10-1, 10-2, . . . , 10-n may include the display panel 100 configured to display an image, and the driver IC 200 configured to drive the display panel 100.

The display panel 100 may include a plurality of pixels arranged in a two dimensional plane as described above, and each pixel may be composed of a plurality of sub-pixels to display various colors.

The display apparatus 1 is a self-luminous display apparatus in which each pixel emits light by itself. Accordingly, an inorganic LED 120 may be disposed in each sub-pixel. That is, each of the plurality of pixels may include two or more inorganic LEDs 120.

Each inorganic LED 120 may be driven by an Active Matrix (AM) method or a Passive Matrix (PM) method, but in an embodiment to be described below, the inorganic LED 120 is driven by the AM method as an example.

In the display module 10 according to one embodiment, each inorganic LED 120 may be individually controlled by a micro-pixel controller 130, and the micro-pixel controller 130 may be operated based on a driving signal output from the driver IC 200.

Referring to FIG. 5, the driver IC 200 may include a scan driver 210 and a data driver 220. The scan driver 210 may output a gate signal configured to turn on/off the sub-pixel, and the data driver 220 may output a data signal configured to realize an image. However, according to various design changes, some of the operations of the driver IC 200 may be performed by the micro-pixel controller 130. For example, the operation of the scan driver 210 may be performed by the micro-pixel controller 130. In this case, the driver IC 200 may not include the scan driver 210. In the embodiment described below, the driver IC 200 may include both the scan driver 210 and the data driver 220.

The scan driver 210 may generate a gate signal based on a control signal transmitted from the timing controller 500, and the data driver 220 may generate a data signal based on image data transmitted from the timing controller 500.

The micro-pixel controller 130 may include a pixel circuit 131 configured to individually control each inorganic LED 120, and a gate signal output from the scan driver 210 and a data signal output from the data driver 220 may be input to the pixel circuit 131.

For example, in response to that a gate voltage $V_{GATE}$, a data voltage $V_{DATE}$, and a power supply voltage $V_{DD}$ are input to the pixel circuit 131, the pixel circuit 131 may output a driving current $C_D$ for driving the inorganic LED 120.

The driving current $C_D$ output from the pixel circuit 131 may be input to the inorganic LED 120, and the inorganic LED 120 may emit light by the input driving current $C_D$ to implement an image.

Referring to an example of FIG. 6, the pixel circuit 131 may include thin film transistors $TR_1$ and $TR_2$ and a capacitor $C_{st}$ configured to switch or drive the inorganic LED 120. As described above, the inorganic LED 120 may be a micro-LED.

For example, the thin film transistors $TR_1$ and $TR_2$ may be a switching transistor $TR_1$ and a driving transistor $TR_2$, and the switching transistor $TR_1$ and the driving transistor $TR_2$ may be implemented as PMOS type transistors. However, embodiments of the display module 10 and the display apparatus 1 are not limited thereto, and the switching transistor $TR_1$ and the driving transistor $TR_2$ may be implemented as NMOS type transistors.

A gate electrode of the switching transistor $TR_1$ is connected to the scan driver 210, a source electrode is connected to the data driver 220, and a drain electrode is connected to one end of the capacitor $C_{st}$ and a gate electrode of the driving transistor $TR_2$. The other end of the capacitor $C_{st}$ may be connected to a first power source 610.

In addition, a source electrode of the driving transistor $TR_2$ is connected to the first power source 610 configured to supply the power supply voltage $V_{DD}$, and a drain electrode is connected to an anode of the inorganic LED 120. A cathode of the inorganic LED 120 may be connected to a second power source 620 configured to supply a reference voltage $V_{SS}$. The reference voltage $V_{SS}$ is a voltage of a lower level than the power supply voltage $V_{DD}$, and a ground voltage or the like may be used as the reference voltage so as to provide a ground.

The pixel circuit 131 having the above-described structure may operate as follows. First, in response to that the switching transistor $TR_1$ is turned on as the gate voltage $V_{GATE}$ is applied from the scan driver 210, the data voltage $V_{DATE}$ applied from the data driver 220 may be transmitted to one end of the capacitor $C_{st}$ and the gate electrode of the driving transistor $TR_2$.

A voltage corresponding to a gate-source voltage $V_{GS}$ of the driving transistor $TR_2$ may be maintained for a predetermined time by the capacitor $C_{st}$. The driving transistor $TR_2$ may apply a driving current $C_D$ corresponding to the gate-source voltage $V_{GS}$ to the anode of the inorganic LED 120 so as to allow the inorganic LED 120 to emit light.

However, the above-described structure of the pixel circuit 131 is only an example applicable to the display module 10 according to an embodiment, and thus in addition to the above-described example, various circuit structures for switching and driving the plurality of inorganic LEDs 120 may be implemented.

In addition, in the embodiment, a method for controlling the brightness of the inorganic LED 120 may vary. The brightness of the inorganic LED 120 may be controlled by one of various methods, such as a pulse amplitude modulation (PAM) method, a pulse width modulation (PWM) method, and a hybrid method combining the PAM method and the PWM method.

Figure 7:
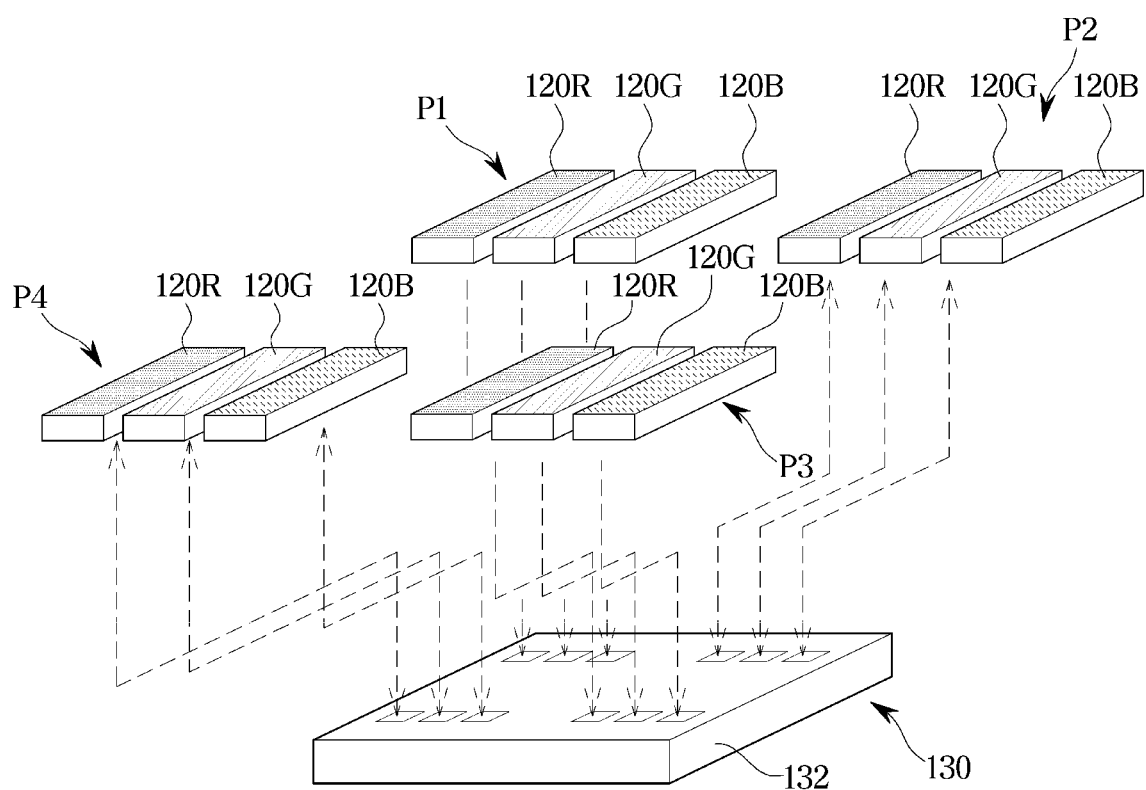
FIG. 7 is a view schematically illustrating an arrangement relationship between a micro-pixel controller and a pixel in a display module according to an embodiment.
Figure 8:
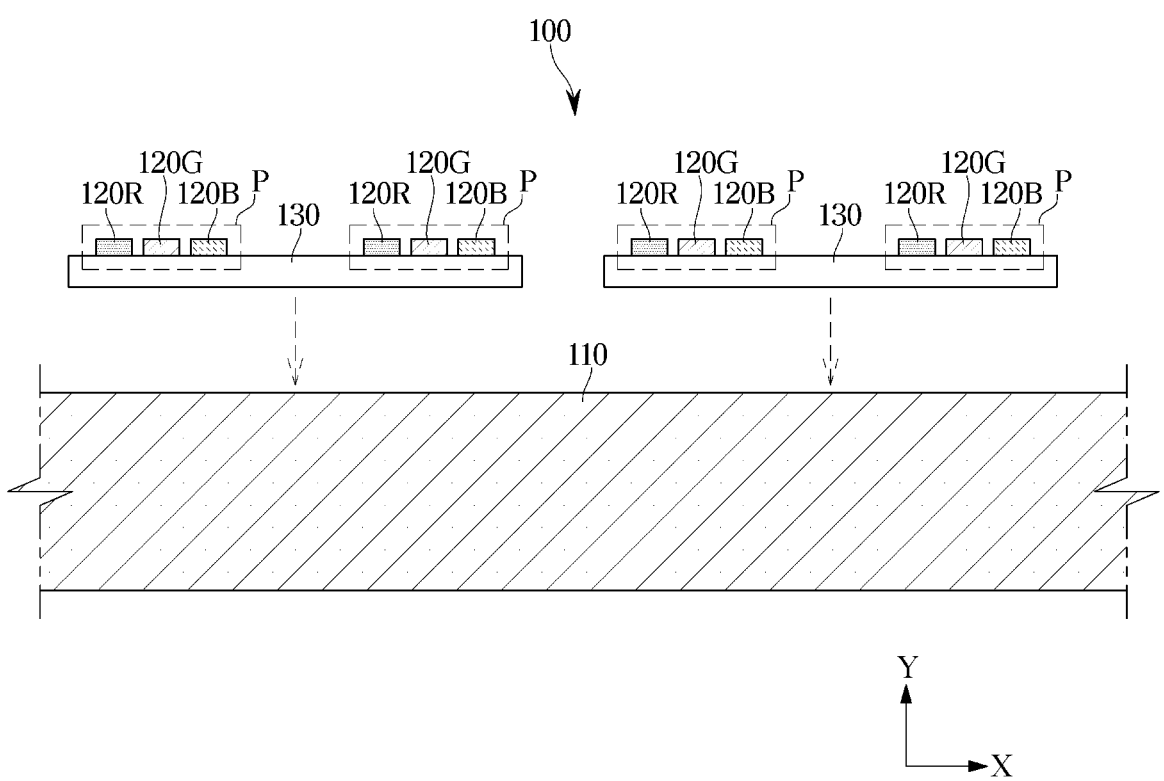
FIG. 8 is a view schematically illustrating an arrangement relationship between a micro-pixel controller and a pixel in a display module according to an embodiment.
Figure 9:
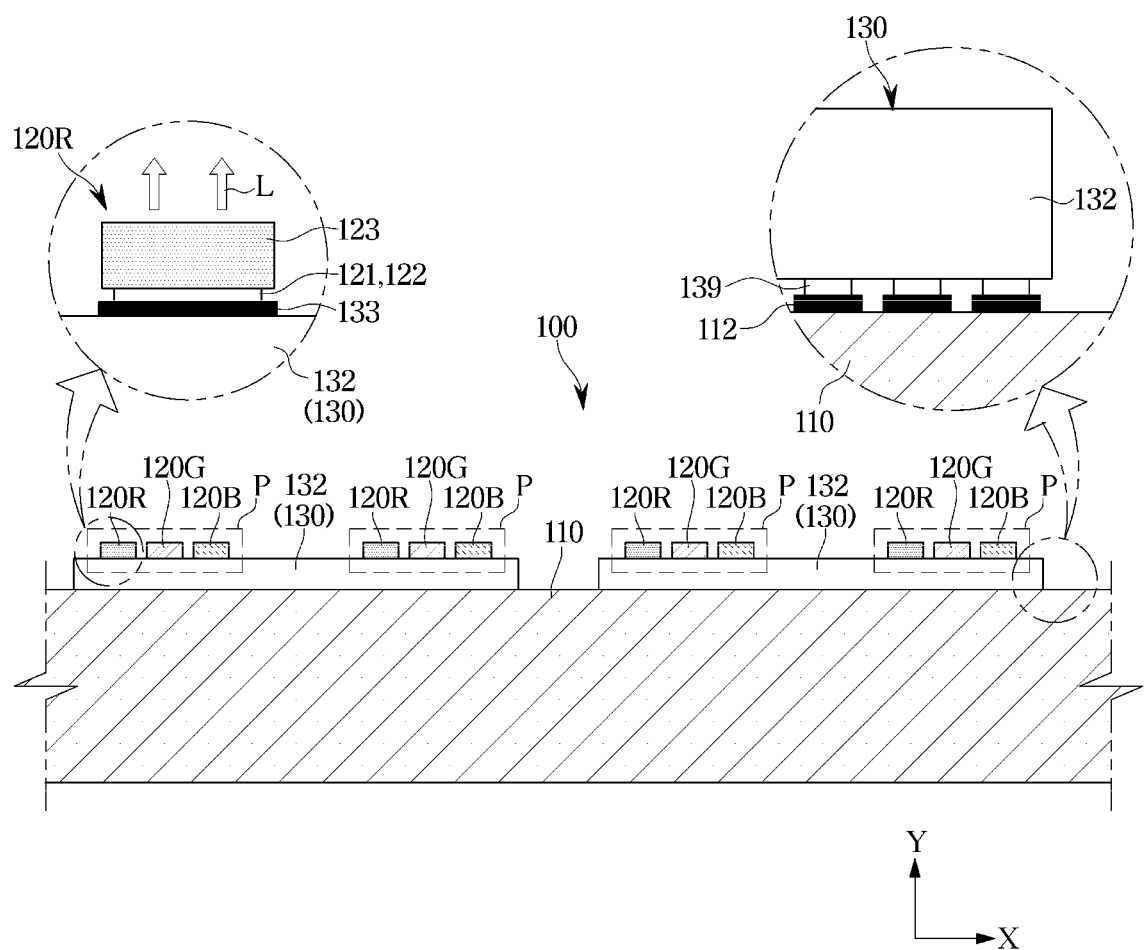
FIG. 9 is a side view illustrating a portion of a display module according to an embodiment.
Figure 10:
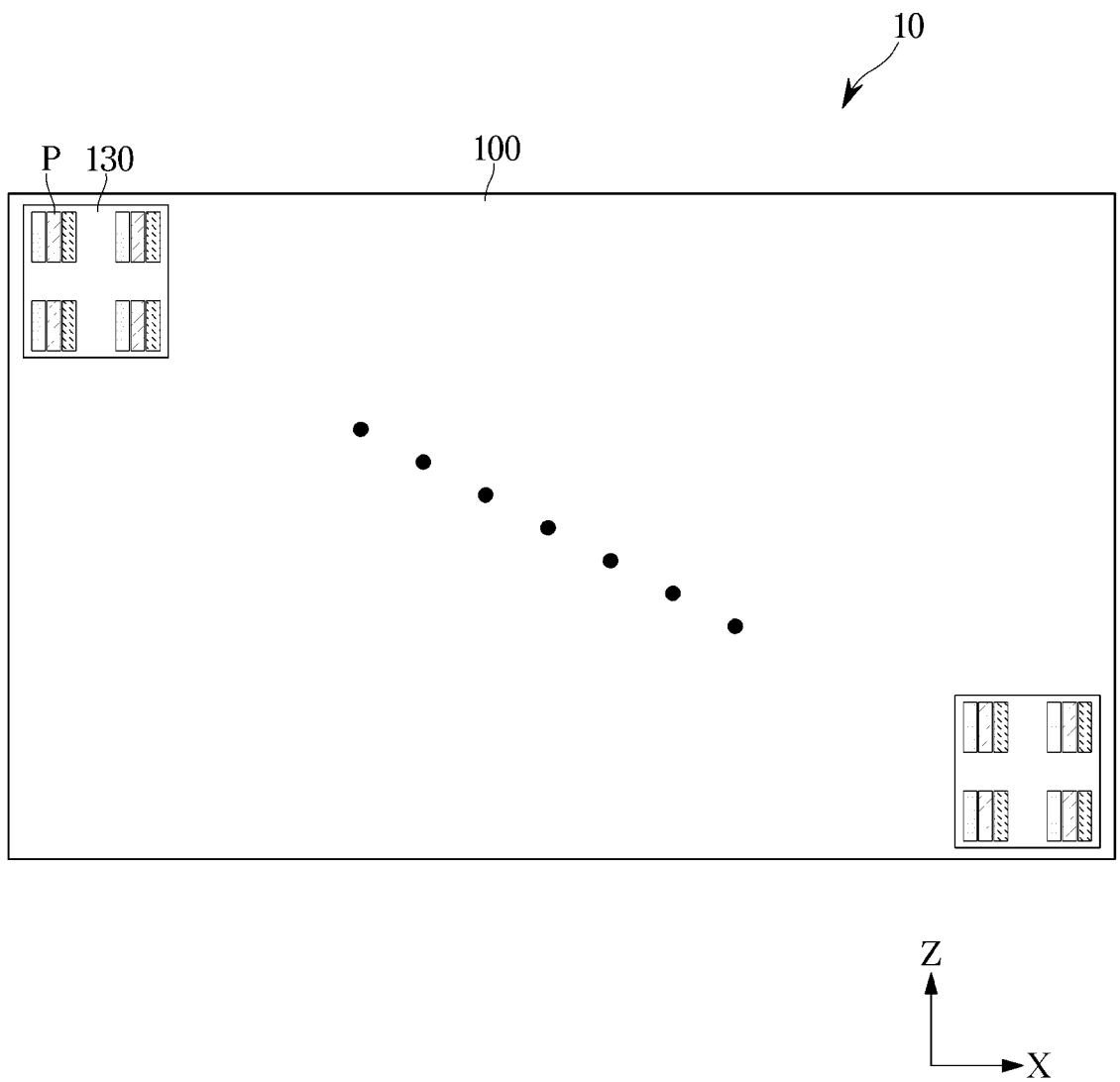
FIG. 10 is a view illustrating an example of an arrangement of a micro-pixel controller constituting a display module according to an embodiment.
Figure 11:
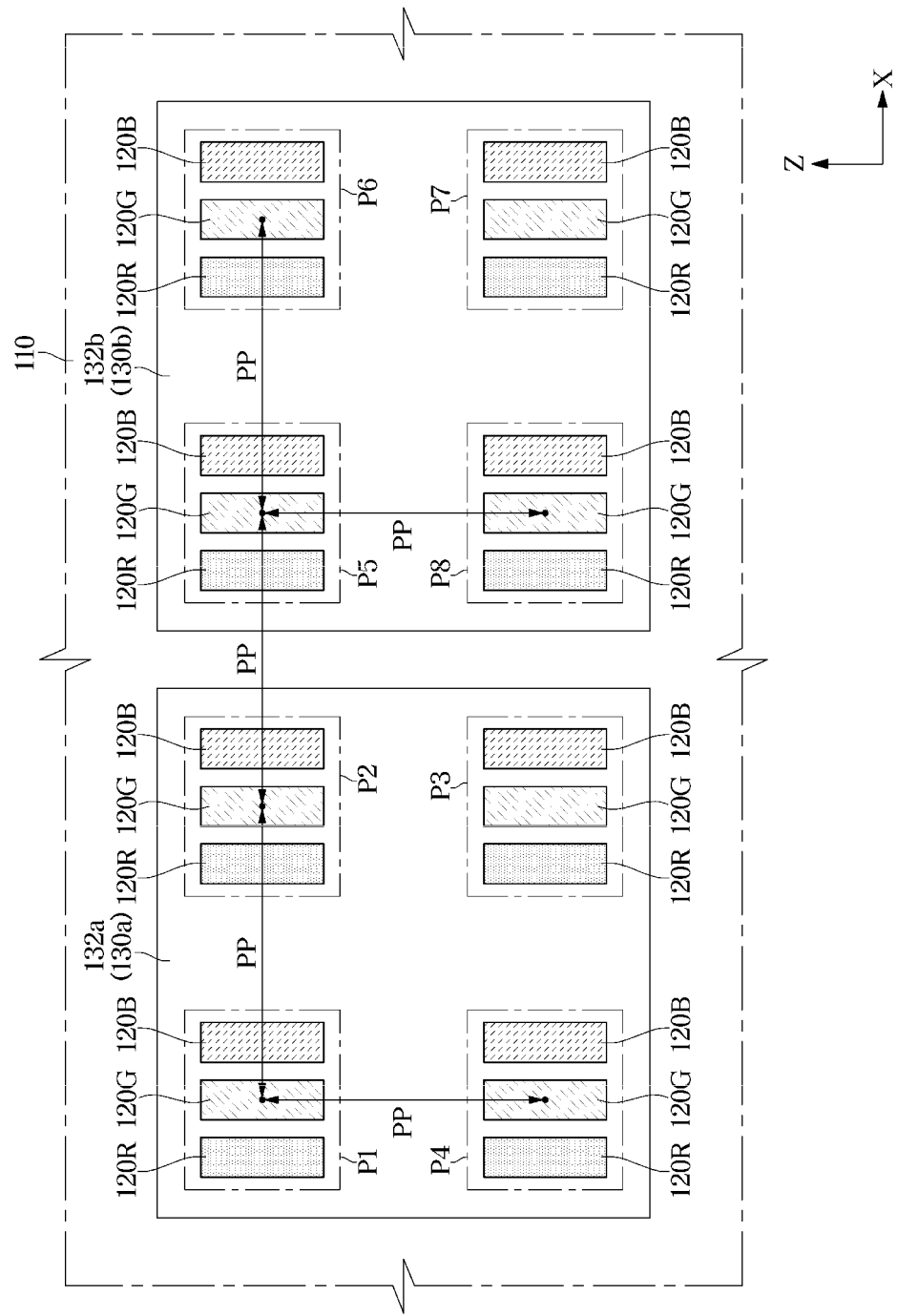
FIG. 11 is a view illustrating an upper surface of a portion of a display module according to an embodiment.

FIG. 7 is a view schematically illustrating an arrangement relationship between the micro-pixel controller 130 and the pixels in the display module 10 according to an embodiment, FIG. 8 is a view schematically illustrating an arrangement relationship between the micro-pixel controller 130 and the pixels in the display module 10 according to an embodiment, FIG. 9 is a side view illustrating a portion of the display module 10 according to an embodiment, FIG. 10 is a view illustrating an example of an arrangement of the micro-pixel controller constituting the display module 10 according to an embodiment, and FIG. 11 is a view illustrating an upper surface of a portion of the display module 10 according to an embodiment.

As for the display module 10, a single micro-pixel controller 130 may control a plurality of pixels. Controlling the pixel may mean controlling the plurality of inorganic LEDs 120 forming the pixel.

A single micro-pixel controller 130 may control pixels arranged in a 2×n array or a n×2 array (n is an integer greater than or equal to 1).

For example, as shown in FIG. 7, a single micro-pixel controller 130 may control four pixels P1, P2, P3, and P4 arranged in a 2×2 array. The plurality of pixel circuits 131 configured to control the inorganic LEDs 120 of the four pixels P1, P2, P3, and P4 may be provided on a second substrate 132 of the micro-pixel controller 130.

It is also possible to provide as many pixel circuits 131 as the number of inorganic LEDs 120 controlled by the micro-pixel controller 130, and it is possible to allow a single pixel circuit 131 to control two or more inorganic LEDs 120.

The second substrate 132 may be a silicon substrate, a glass substrate, or a plastic substrate.

A thin film transistor formed on the second substrate 132 may be a low temperature polycrystalline silicon (LTPS) thin film transistor or an oxide thin film transistor. The thin film transistor may be an a-Si thin film transistor or a single crystal thin film transistor. However, in the embodiment, a case in which the thin film transistor is an LTPS thin film transistor will be described as an example for detailed description.

As mentioned above, the second substrate 132 may be implemented as a silicon substrate. The silicon substrate has no restrictions on electron mobility in comparison with the glass substrate, and thus the performance of the LTPS thin film transistor may be improved when the second substrate 132 is implemented as a silicon substrate.

In this case, a plurality of pixels may be disposed on an upper surface of the second substrate 132 of a single micro-pixel controller 130. In other words, the plurality of inorganic LEDs 120 forming the plurality of pixels may be disposed on the upper surface of the second substrate 132 of the micro-pixel controller 130.

Accordingly, the plurality of inorganic LEDs 120 forming two or more pixels may be electrically connected to the upper surface of the second substrate 132 of the single micro-pixel controller 130, and the micro-pixel controller 130 may be electrically connected to the plurality of inorganic LEDs 120 forming two or more pixels so as to control the two or more pixels.

Because the inorganic LED 120 is disposed on the upper surface of the micro-pixel controller 130, the inorganic LED 120 may be positioned on a higher layer than the micro-pixel controller 130. Accordingly, it is possible to prevent a decrease in the viewing angle that may occur when the micro-pixel controller 130 covers the inorganic LED 120 from the side in a state in which the inorganic LED 120 and the micro-pixel controller 130 are located on the same layer.

In addition, the display module 10, by arranging the inorganic LED 120 on the upper surface of the micro-pixel controller 130, may not be individually packaged during a packing process, in which the inorganic LED and the micro-pixel controller are mounted on a separate substrate. Therefore, it is possible to reduce the difficulty of the manufacturing process of the display module 10.

For example, as shown in FIG. 7, four pixels P1, P2, P3, and P4 may be disposed on the upper surface of the second substrate 132 of a single micro-pixel controller 130. That is, the inorganic LEDs 120 forming the four pixels P1, P2, P3, and P4 may be disposed on the upper surface of the second substrate 132 of the micro-pixel controller 130. The number of pixels that are arranged on the upper surface of a single micro-pixel controller 130 may vary, but an example in which four pixels are arranged on the upper surface of the second substrate 132 will be described for the convenience of description.

Referring to FIGS. 8 and 9, each of the plurality of micro-pixel controllers 130, on which the plurality of inorganic LEDs 120 forming the plurality of pixels is disposed on the upper surface thereof, may be disposed on an upper surface of a first module substrate 110 corresponding to the module substrate, and thus the each of the plurality of micro-pixel controllers 130 may be electrically connected to the first substrate 110.

In other words, the plurality of inorganic LEDs 120 may be electrically connected to the upper surface of the second substrate 132 of the micro-pixel controller 130, and the micro-pixel controller 130 may be electrically connected to the upper surface of the first substrate 110.

The first substrate 110 may be a glass substrate or a plastic substrate. The type of the first substrate 110 may vary, but in the one or more embodiments of the disclosure, the first substrate 110 will be described as a glass substrate as an example for detailed description.

In FIG. 9, a red inorganic LED 120R is enlarged as an example among the plurality of inorganic LEDs 120R, 120G, and 120B forming the single pixel P, and a part of the micro-pixel controller 130 is enlarged. For convenience of description, only the red inorganic LED 120R is enlarged, but the remaining inorganic LEDs 120G and 120B may also be electrically connected to the second substrate 132 in the same manner.

Referring to FIG. 9, in the embodiment, the inorganic LED 120 may include a flip chip structure in which a pair of electrodes 121 and 122 are disposed on opposite surfaces of a light emitting surface of a diode 123.

The pair of electrodes 121 and 122 may include an anode 121 and a cathode 122. For example, the anode 121 and the cathode 122 may be provided at opposite ends of the inorganic LED 120 in a longitudinal direction (vertical direction), respectively. A drawing of FIG. 9 illustrates the inorganic LED 120 as viewed from the short side, and only one electrode illustrated thereon. The illustrated electrode may be the anode 121 or the cathode 122.

The inorganic LED 120 may be disposed in such a way that the light emitting surface faces the upper direction (+Y-axis direction), and the electrodes 121 and 122 provided on the opposite surface of the light emitting surface may be electrically connected to an upper connection pad 133 provided on the upper surface of the second substrate 132.

An electrical connection between the two components according to the embodiment may include not only a case in which conductive materials, through which electricity is passed, are directly soldered, but also include a case in which the two components are connected through separate wires or using a conductive adhesive. As long as a current flows between the two components, the specific connection method may vary.

For example, when soldering two components, Au—In junction, Au—Sn junction, Cu pillar/SnAg bump junction, Ni pillar/SnAg bump junction, SnAgCu, SnBi, SnAg solder ball junction, etc. may be used.

In addition, when using a conductive adhesive, a conductive adhesive such as an anisotropic conductive film (ACF) or an anisotropic conductive paste (ACP) may be placed between the two components and a pressure may be applied thereto, thereby allowing a current to flow in a direction in which the pressure is applied.

A lower connection pad 139 for electrical connection with the first substrate 110 may be provided on a lower surface of the second substrate 132, and the lower connection pad 139 may be electrically connected to an upper wiring pad 112 provided on the upper surface of the first substrate 110.

According to the one or more embodiments of the display module 10, circuit elements such as thin film transistors for switching and driving the plurality of inorganic LEDs 120 are provided in a separate micro-pixel controller 130 instead of the first substrate 110. Therefore, it is possible to individually perform circuit inspection for each micro-pixel controller 130, and it is possible to mount only the micro-pixel controller 130, which is determined as a faultless product by the circuit inspection, on the display module 10. Therefore, in comparison with the case in which the thin film transistor circuit is directly mounted on the module substrate (the first substrate), it is possible to facilitate the circuit inspection and the replacement of defective products.

Furthermore, the electrode pad (e.g., the lower connection pad 139) of the micro-pixel controller 130 is larger than the electrodes 121 and 122 of the inorganic LED 120, and the inorganic LED 120 is disposed on the upper surface of the micro-pixel controller 130 and electrically connected to the micro-pixel controller 130. Therefore, it is possible to determine whether the inorganic LED 120 is of good quality or not through electrical conduction through the electrode pad of the micro-pixel controller 130.

As a result, the display panel 100 of the display module 10 may have a structure in which the plurality of micro-pixel controllers 130 is arranged in the two dimensions, as shown in FIG. 10. In addition, the display panel 100 of the display module 10 may have a pixel structure in the two dimensions because the plurality of unit pixels P is disposed on the upper surface of each of the plurality of micro-pixel controllers 130.

FIG. 11 is an enlarged view illustrating a portion of the upper surface of the display panel 100, and particularly, illustrating a case in which two micro-pixel controllers 130 are arranged adjacent to one another and arranged on the upper surface the first substrate 110 of the display panel 100.

An interval between adjacent pixels among a plurality of pixels included in the display panel 100 may all be the same. However, certain values that are the same may not only include a case in which the values are completely identical, but also include a case in which the values are identical within a certain error range.

That is, a pixel interval (that is, pixel pitch PP) between pixels disposed on the upper surface of one micro-pixel controller 130 may be the same. In addition, the pixel interval (that is, pixel pitch PP) between adjacent pixels among pixels disposed on each of the adjacent micro-pixel controllers 130 may be also the same as a pixel interval (that is, pixel pitch PP) between pixels disposed on the upper surface of one micro-pixel controller 130.

Particularly, as shown in FIG. 11, the pixel interval (that is, pixel pitch PP) between adjacent pixels among the pixels P1, P2, P3, and P4 disposed in one micro-pixel controller 130 may be the same. For example, among the pixels P1, P2, P3, and P4 disposed on an upper surface of a first micro-pixel controller 130a, an interval between a first pixel P1 and a second pixel P2 may be the same as an interval between the first pixel P1 and a fourth pixel P4.

Further, a pixel interval (that is, pixel pitch PP) between adjacent pixels among pixels disposed in adjacent micro-pixel controllers 130a and 130b may be equal to a pixel interval (that is, pixel pitch PP) between pixels disposed in one micro-pixel controller 130. For example, a pixel interval (that is, pixel pitch PP) between two or more pixels disposed on a second substrate 132a of the first micro-pixel controller 130a may be the same as a pixel interval (that is, pixel pitch PP) between the second pixel P2 disposed on the second substrate 132a of the first micro-pixel controller 130a, and a fifth pixel P5 disposed on a second substrate 132b of a second micro-pixel controller 130b, which is adjacent to the first micro-pixel controller 130a, and adjacent to the second pixel P2.

The micro-pixel controller 130 according to one embodiment is disposed on the lower surface of the inorganic LED 120, and thus when the plurality of inorganic LEDs 120R, 120G, and 120B are disposed on the upper surface of the first substrate 110, the arrangement of the plurality of inorganic LEDs 120R, 120G, and 120B may not be affected by a position or a size of the micro-pixel controller 130.

The pixel interval may be referred to as a pixel pitch PP, and the pixel pitch PP is defined as a distance from the center of one pixel to the center of an adjacent pixel. However, the one or more embodiments of the display module 10 are not limited thereto, and thus another definition for the pixel pitch PP may be applied.

According to the one or more embodiments of the display module 10, because the plurality of inorganic LEDs 120 is disposed on the upper surface of the micro-pixel controller 130, it is possible to reduce the pixel pitch so as to obtain a higher resolution image in the same area in comparison with the case in which both the micro-pixel controller (thin-film transistor circuit) and the inorganic LED are mounted on the module substrate (first substrate). Further, necessary components may be mounted on the micro-pixel controller 130 without the limitation in the size due to the pixel pitch PP.

That is, by arranging the inorganic LED 120 on the upper surface of the micro-pixel controller 130, it is possible to prevent a case in which the micro-pixel controller (thin film transistor circuit) is arranged between pixels, which may occur when the inorganic LED 120 and the micro-pixel controller 130 are disposed on the same layer. Therefore, by reducing the pixel pitch, it is possible to provide the high-resolution image by providing more pixels in the same area.

In the above description, it has been described with respect to the arrangement relationship between the inorganic LED 120, the micro-pixel controller 130, and the first substrate 110. Hereinafter an electrical connection between the inorganic LED 120, the micro-pixel controller 130, and the first substrate 110 through a blind vertical interconnect access (blind VIA) or a vertical interconnect access hole (VIA hole) will be described.

Figure 12:
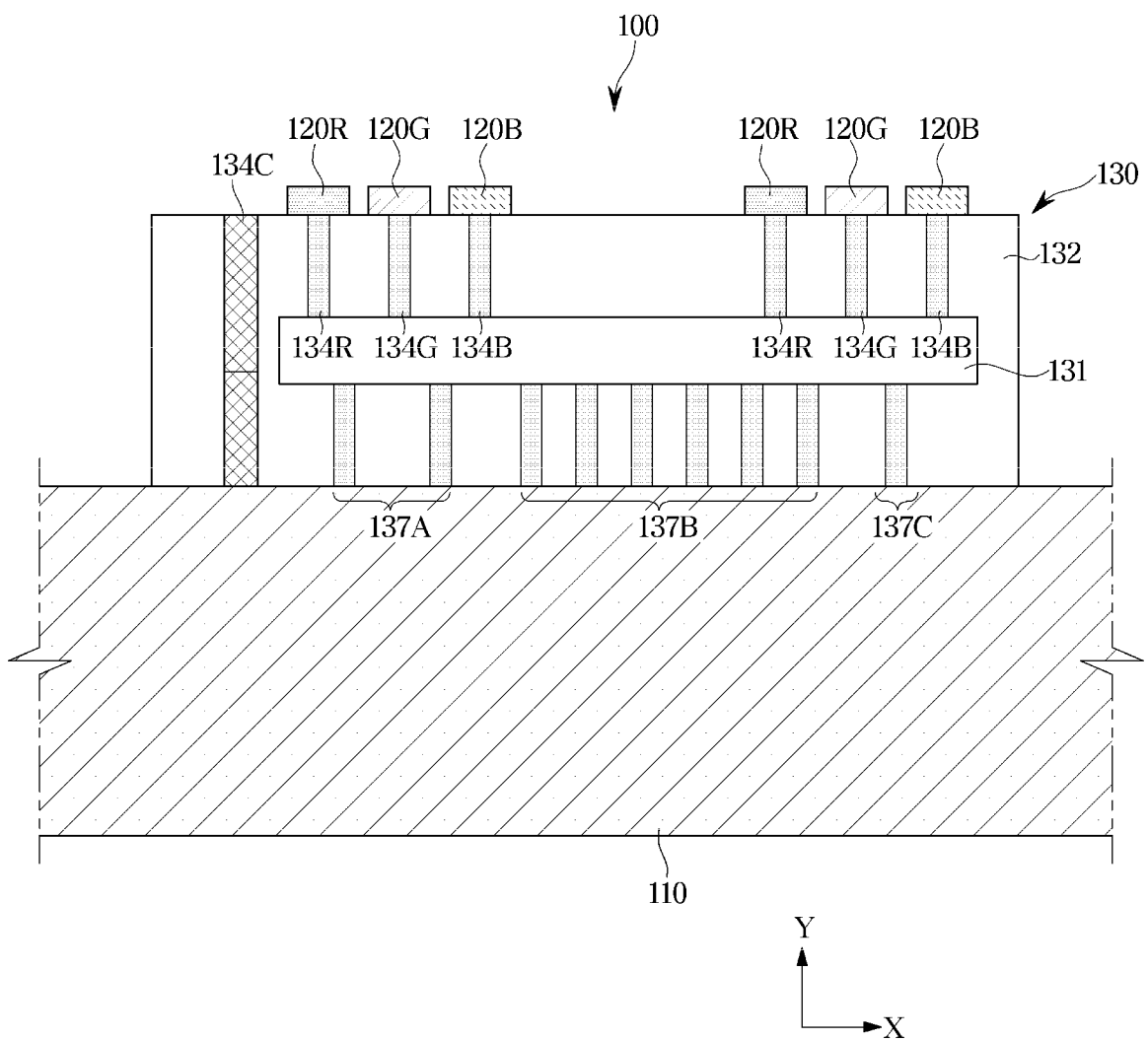
FIG. 12 is a side view schematically illustrating an electrical connection relationship between an inorganic light emitting diode (LED), a micro-pixel controller and a module substrate in a display module according to an embodiment.
Figure 13:
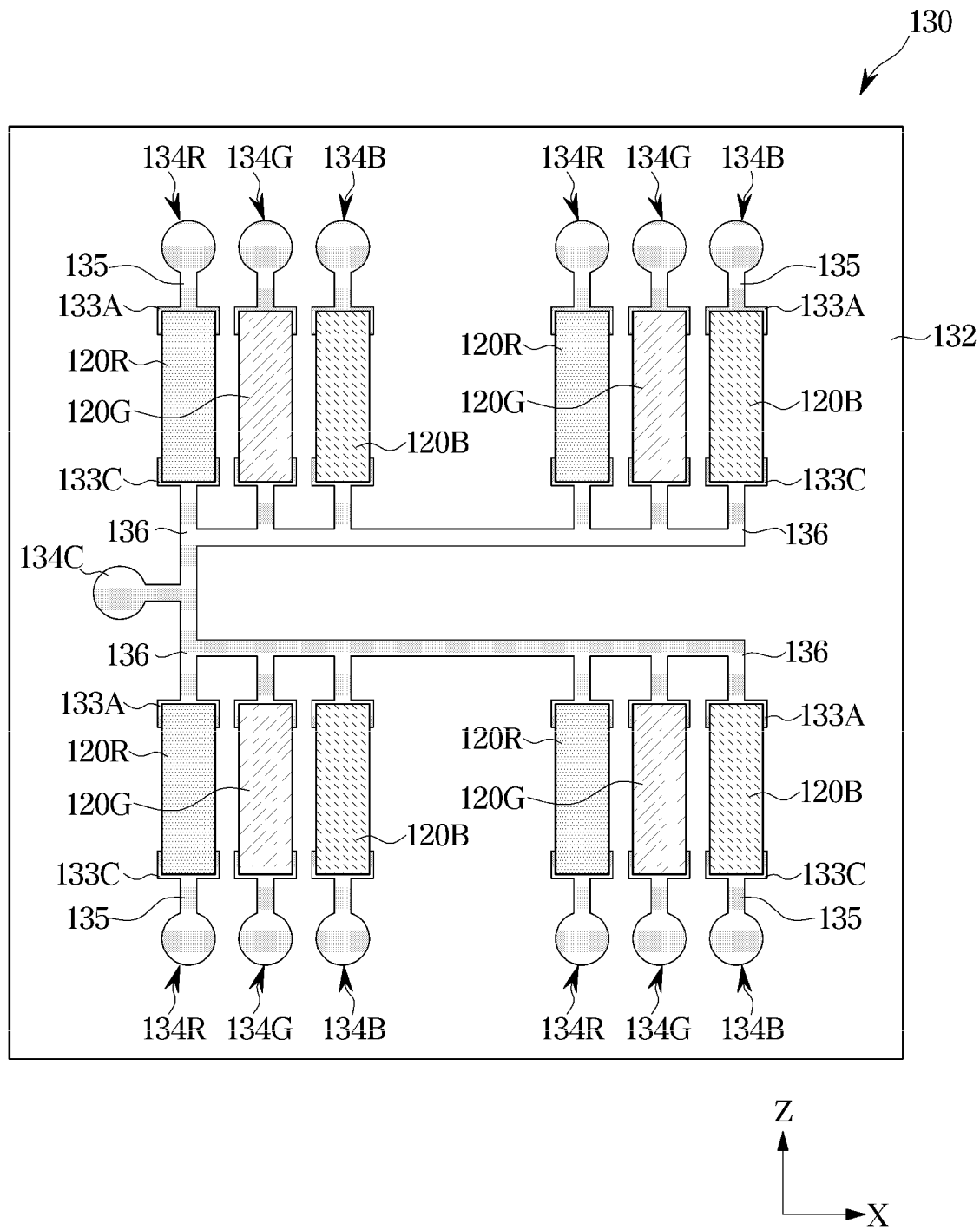
FIG. 13 is a view illustrating an upper surface of a micro-pixel controller, to which an inorganic LED is mounted, in a display module according to an embodiment.
Figure 14:
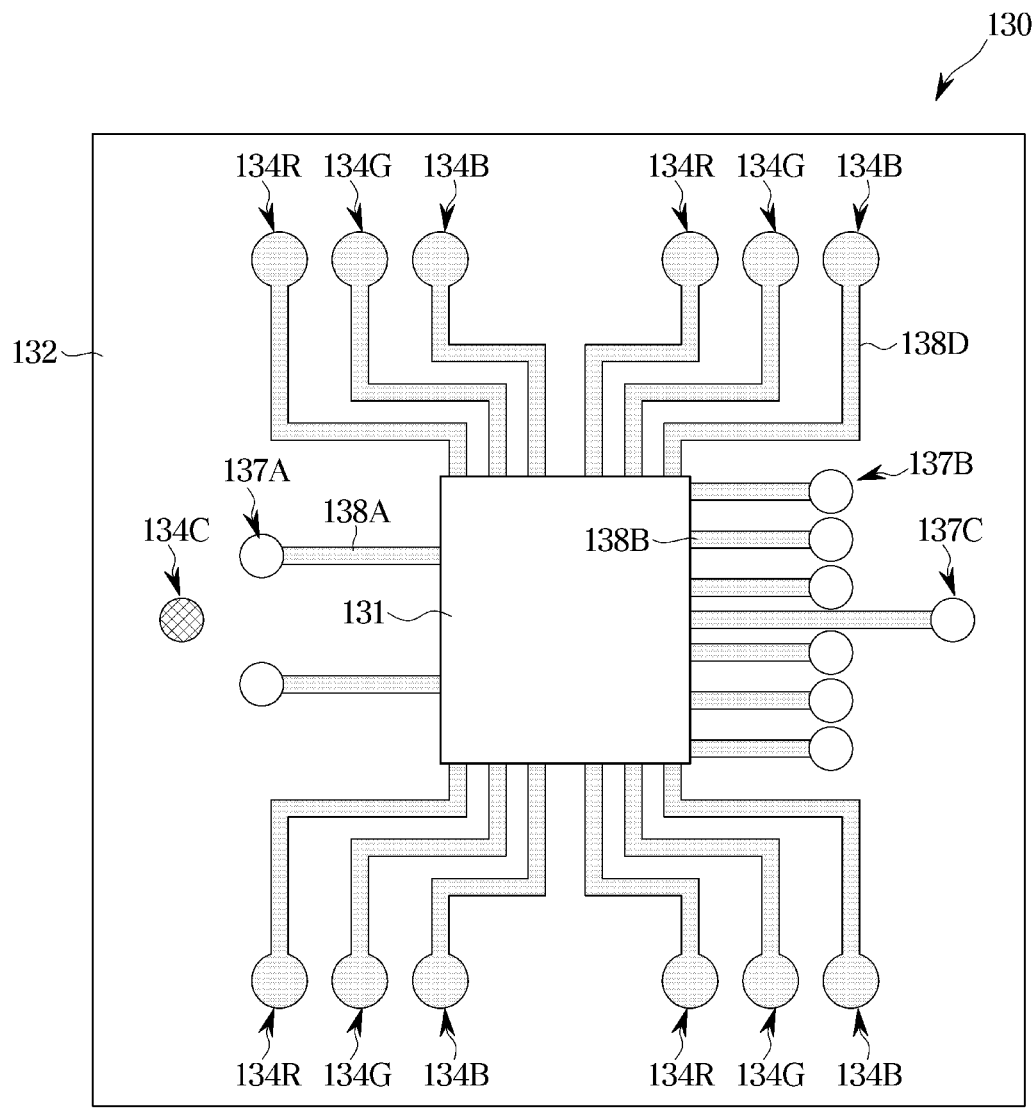
FIG. 14 is a view illustrating an inner surface of a micro-pixel controller in a display module according to an embodiment.

FIG. 12 is a side view schematically illustrating an electrical connection relationship between the inorganic LED 120, the micro-pixel controller 130, and the module substrate 110 in the display module 10 according to an embodiment, FIG. 13 is a view illustrating the upper surface of the micro-pixel controller 130, to which the inorganic LED 120 is mounted, in the display module 10 according to an embodiment, and FIG. 14 is a view illustrating an inner surface the micro-pixel controller 130 in the display module 10 according to an embodiment.

Referring to FIG. 12, a connection method through a blind via may be used as an example for electrically connecting the plurality of inorganic LEDs 120R, 120G, and 120B disposed on the upper surface of the second substrate 132 to the pixel circuit 131 provided on the second substrate 132, and for electrically connecting the pixel circuit 131 to the first substrate 110.

Particularly, the plurality of inorganic LEDs 120R, 120G, and 120B disposed on the upper surface of the second substrate 132 may be electrically connected to the pixel circuit 131 provided on the second substrate 132 through a plurality of first blind vias 134R, 134G, and 134B. That is, the anode 121 of each of the plurality of inorganic LEDs 120R, 120G, and 120B may be electrically connected to the pixel circuit 131 through the first blind vias 134R, 134G, and 134B. Accordingly, the driving current supplied from the pixel circuit 131 may be supplied to the anode 121 through the first blind vias 134R, 134G, and 134B.

The pixel circuit 131 may include at least one thin film transistor configured to supply a driving current to each of the plurality of inorganic LEDs 120R, 120G, and 120B.

Further, the pixel circuit 131 disposed on the second substrate 132 may be electrically connected to the first substrate 110 through second blind vias 137A, 137B, and 137C. That is, at least one thin film transistor of the pixel circuit 131 may receive a gate signal, a data signal, and a power supply voltage $V_{DD}$ from the wiring of the first substrate 110 through the second blind vias 137A, 137B, and 137C.

In addition, the second blind vias 137A, 137B, and 137C may include a blind via 137A for the gate signal, a blind via 137B for the data signal, and a blind via 137C for the power supply voltage $V_{DD}$.

The plurality of inorganic LEDs 120 disposed on the upper surface of the second substrate 132 may be electrically connected to the first substrate 110 through a via hole 134C. That is, the cathode 122 of each of the plurality of inorganic LEDs 120R, 120G, and 120B may be electrically connected to the first substrate 110 through the via hole 134C. Accordingly, the reference voltage $V_{SS}$ supplied from the first substrate 110 may be supplied to the cathode 122 through the via hole 134C.

An inner wall of the via hole 134C and the blind vias 134R, 134G, 134B, 137A, 137B, and 137C may be plated with a conductive material such as copper, and a filling material may be filled through VIA filling for filling the via hole 134C and the blind vias 134R, 134G, 134B, 137A, 137B, and 137C with the filling material. The filling material filled in the via hole 134C and the blind vias 134R, 134G, 134B, 137A, 137B, and 137C may be a conductive material or a non-conductive material. In an embodiment, the via hole 134C formed through the second substrate 132, and the blind vias 134R, 134G, 134B, 137A, 137B, and 137C may be referred to as the via hole wiring 134C and the blind via wirings 134R, 134G, 134B, 137A, 137B, and 137C.

FIG. 13 is an example of a wiring structure of the upper surface of the second substrate 132 of the micro-pixel controller 130. Referring to FIG. 13, a blind via wiring 134R configured to electrically connect the anode 121 of the red inorganic LED 120R, which is disposed on the upper surface of the second substrate 132, to the pixel circuit 131 disposed on the second substrate 132, a blind via wiring 134G configured to electrically connect the anode 121 of the green inorganic LED 120G, which is disposed on the upper surface of the second substrate 132, to the pixel circuit 131 disposed on the second substrate 132, and a blind via wiring 134B configured to electrically connect the anode 121 of the red inorganic LED 120B, which is disposed on the upper surface of the second substrate 132, to the pixel circuit 131 disposed on the second substrate 132 may be formed on the upper surface of the second substrate 132.

Among the upper connection pads 133 formed on the upper surface of the second substrate 132, an anode pad 133A connected to the anode 121 of each inorganic LED 120 may be connected to the blind via wirings 134R, 134G, and 134B through an anode wiring 135 among the upper wirings of the second substrate 132.

The common reference voltage $V_{SS}$ may be applied to the cathode 122 of the plurality of inorganic LEDs 120R, 120G, and 120B. The via hole wiring 134C for applying the common reference voltage $V_{SS}$ to the cathode 122 may be formed on the second substrate 132 and a cathode pad 133C connected to the cathode 122 of each inorganic LED 120 may be connected to the via hole wiring 134C by a cathode wiring 136 among the upper wirings of the second substrate 132.

FIG. 14 is an example of a wiring structure of an inner surface of the second substrate 132. Referring to FIG. 14, the first blind via wirings 134R, 134G, and 134B of the second substrate 132 may be electrically connected to the pixel circuit 131 through internal wirings formed in the second substrate 132.

Particularly, the first blind via wirings 134R, 134G, and 134B connected to the anode 121 of the inorganic LEDs 120R, 120G, and 120B may be electrically connected to the pixel circuit 131 through an internal wiring 138D.

The driving current CD generated in the pixel circuit 131 may be applied to the anode 121 of the inorganic LEDs 120R, 120G, and 120B through the internal wiring 138D, the via hole wirings 134R, 134G, and 134B, the anode wiring 135.

The via hole wiring 134C connected to the cathode 122 of the inorganic LEDs 120R, 120G, and 120B may be electrically connected to a Field Programmable Circuit Board (FPCB) for supplying power through the first substrate 110 so as to apply the reference voltage $V_{SS}$ to the cathode 122 of the inorganic LEDs 120R, 120G, and 120B.

Further, internal wirings 138A, 138B, and 138C for applying a gate signal, a data signal, and a power supply voltage $V_{DD}$ to the pixel circuit 131 may be formed on the inner surface of the second substrate 132. Particularly, the internal wirings 138A, 138B, and 138C may include an internal wiring 138A configured to electrically connect the blind via wiring 137A for a gate signal to the pixel circuit 131, an internal wiring 138B configured to electrically connect the blind via wiring 137B for a data signal to the pixel circuit 131, and an internal wiring 138C configured to electrically connect the blind via wiring 137C for a power supply voltage $V_{DD}$ to the pixel circuit 131.

Each of the blind via wirings 137A, 137B, and 137C may be electrically connected to an upper wiring provided on the upper surface of the first substrate 110, and receive the driving signal and the power supply voltage $V_{DD}$ so as to transmit the driving signal and the power supply voltage $V_{DD}$ to the pixel circuit 131. That is, the driving signal and the power supply voltage $V_{DD}$ may be applied to the pixel circuit 131 through the upper wiring of the first substrate 110, the blind via wirings 137A, 137B, and 137C, and the internal wirings 138A, 138B, and 138C.

Accordingly, the pixel circuit 131 may be electrically connected to the first substrate 110 and the inorganic LED 120 through the blind vias and via holes provided on the inner surface of the second substrate 132 of the micro-pixel controller 130.

In this case, the first blind vias 134R, 134G, and 134B configured to electrically connect the pixel circuit 131 to the inorganic LED 120 may be an upward blind via forming a via in an upward direction (+Y-axis direction), or the second blind vias 137A, 137B, and 137C configured to electrically connect the pixel circuit 131 to the first substrate 110 may be a downward blind via forming a via in a downward direction (−Y-axis direction). Further, the via hole 134C configured to electrically connect the cathode 122 of the inorganic LED 120 to the first substrate 110 may be a via passing through the second substrate 132.

The wiring structure illustrated in FIGS. 12 to 14 described above is only an example of the display module 10. Various wiring structures other than the above-described wiring structures may be applicable to the one or more embodiments of the display module 10.

Figure 15:
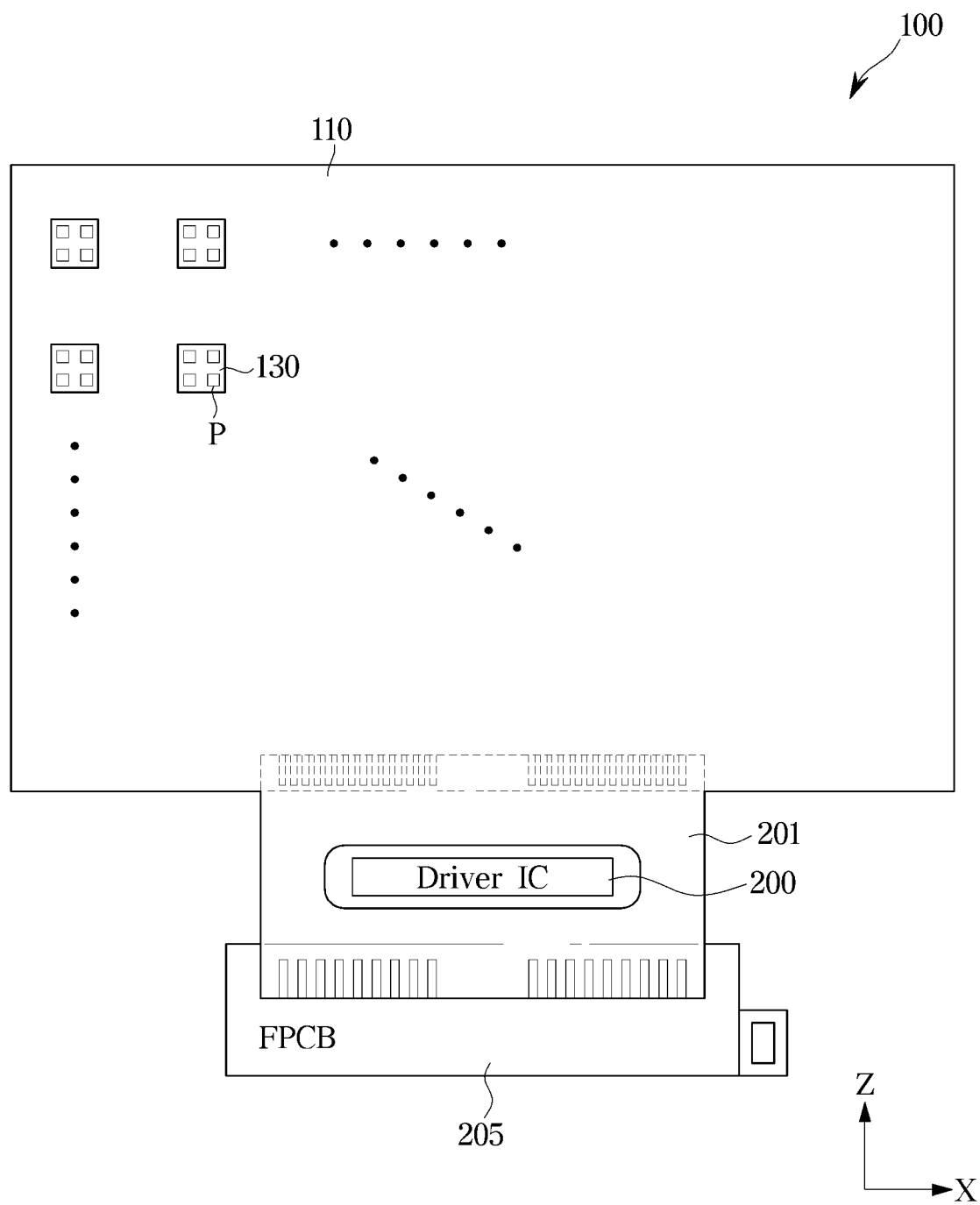
FIG. 15 is a view illustrating an example of a method for electrically connecting a display panel to a driver integrated circuit (IC) in a display module according to an embodiment.

FIG. 15 is a view illustrating an example of a method for electrically connecting the display panel 100 to the driver IC 200 in the display module 10 according to an embodiment.

The plurality of micro-pixel controllers 130 may be arranged on the first substrate 110 of the display panel 100, and the upper wiring provided on the upper surface of the first substrate 110 may supply the driving signal and the power supply voltage $V_{DD}$ to each of the plurality of micro-pixel controllers 130. Accordingly, the each of the plurality of micro-pixel controllers 130 may drive the pixel P provided on the upper surface. As such, the drive IC 200 may be electrically connected to the first substrate 110 of the display panel 100 to transmit a driving signal and a power supply voltage $V_{DD}$.

The driver IC 200 may be electrically connected to the display panel 100 according to one of various bonding methods such as Chip on Film (COF) or Film on Glass (FOG) bonding, Chip on Glass (COG) bonding, Tape Automated Bonding (TAB), etc.

For example, when COF bonding is used, the driver IC 200 may be mounted on a film 201, and one end of the film 201, on which the driver IC 200 is mounted, may be electrically connected to the first substrate 110 and the other end of the film 201, on which the driver IC 200 is mounted, may be electrically connected to the FPCB 205, as shown in FIG. 15.

One end of the film 201, on which the driver IC 200 is mounted, may be electrically connected to any one of the upper wiring pad 112 provided on the upper surface of the first substrate 110 or a lower wiring pad provided on the lower surface of the first substrate 110. The upper wiring pad 112 or the lower wiring pad electrically connected to the film 201, on which the driver IC 200 is mounted, may be electrically connected to the micro-pixel controller 130 through the upper wiring provided on an upper portion of the first substrate 110. The micro-pixel controller 130 may receive a gate signal and a data signal from the driver IC 200 through a corresponding upper wiring.

Figure 16:
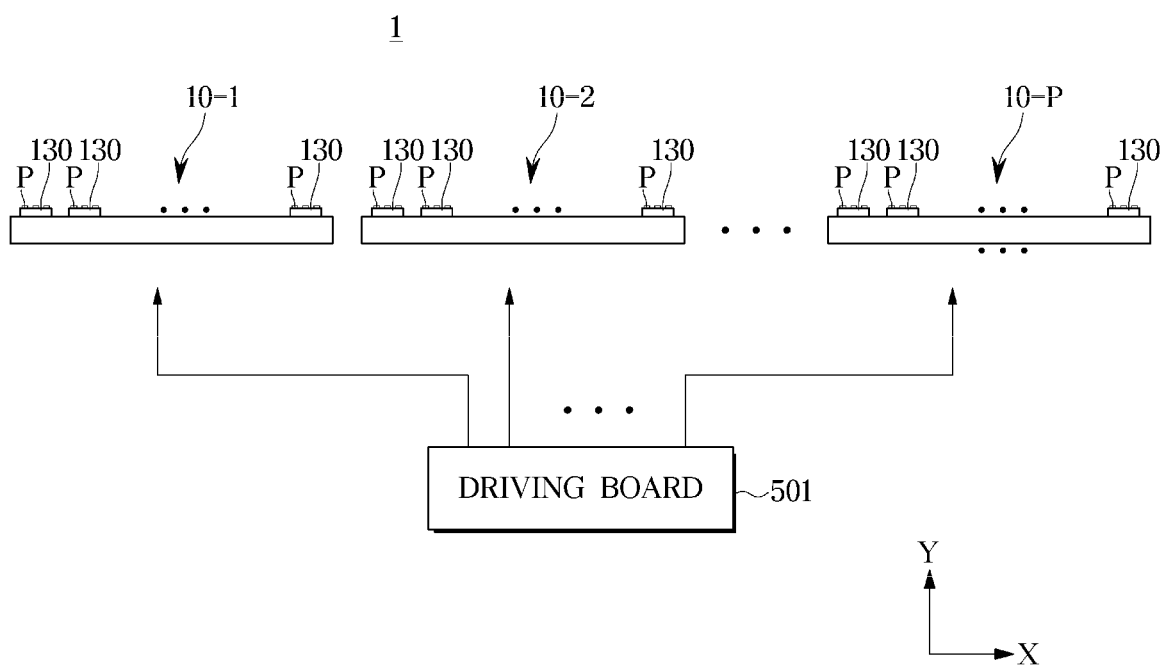
FIGS. 16 and 17 are views illustrating an example of a signal transmitted to a plurality of display modules tiled on a display apparatus according to an embodiment.
Figure 17:
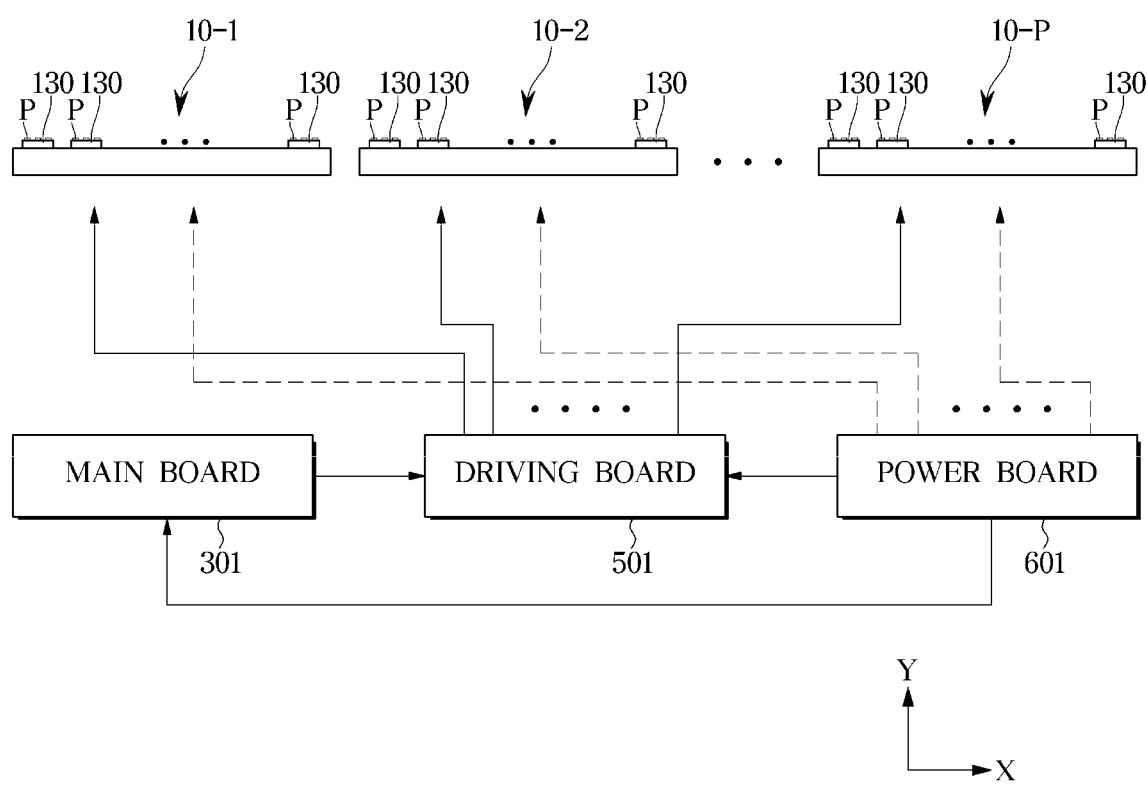

FIGS. 16 and 17 are views illustrating an example of a signal transmitted to the plurality of display modules 10 tiled on the display apparatus 1 according to an embodiment.

Referring to FIG. 16, it is possible to implement the display apparatus 1 having the large-size screen by tiling the plurality of display modules 10-1, 10-2, . . . , 10-n. FIGS. 16 and 17 are views illustrating the display apparatus 1 on the X-Y plane, particularly, arranging the display modules 10-1, 10-2, . . . , 10-P in one-dimension. However, it is possible to arrange the plurality of display modules 10-1, 10-2, . . . , 10-n in two-dimensions as described with reference to FIG. 1.

Referring back to FIG. 15, the display panel 100 may be connected to the FPCB 205 through the film 201 on which the driver IC 200 is mounted. The FPCB 205 may be connected to a driving board 501 to electrically connect the display module 10 to the driving board 501.

The timing controller 500 may be provided on the driving board 501. Accordingly, the driving board 501 may be referred to as a T-con board. The plurality of display modules 10-1, 10-2, . . . , 10-n may receive image data, a timing control signal, and the like from the driving board 501.

Referring to FIG. 17, the display apparatus 1 may further include a main board 301 and a power board 601. The above-described main controller 300 may be provided on the main board 301, and a power supply circuit configured to supply power to the plurality of display modules 10-1, 10-2, . . . , 10-n may be provided on the power board 601.

The power board 601 may be electrically connected to the plurality of display modules 10-1, 10-2, . . . , 10-n through the FPCB, and the power board 601 may supply the power supply voltage $V_{DD}$, and the reference voltage $V_{SS}$ to the plurality of display modules 10-1, 10-2, . . . , 10-n connected through the FPCB.

For example, the power supply voltage $V_{DD}$ supplied from the power board 601 may be applied to the micro-controller 130 disposed on the upper surface of the first substrate 110 through the upper wiring, and the reference voltage $V_{SS}$ may be applied to the pixel P disposed on the upper surface of the micro-pixel controller 130 through the upper wiring of the first substrate 110 and the via hole wiring 134C of the micro-pixel controller 130.

In the above example, it has been described that the plurality of display modules 10-1, 10-2, . . . , 10-P share the driving board 501, but a separate driving board may be connected to each display module 10. Alternatively, it is also possible to group the plurality of display modules 10-1, 10-2, . . . , 10-P and connect one driving board 501 to each group of display modules.

Figure 18:
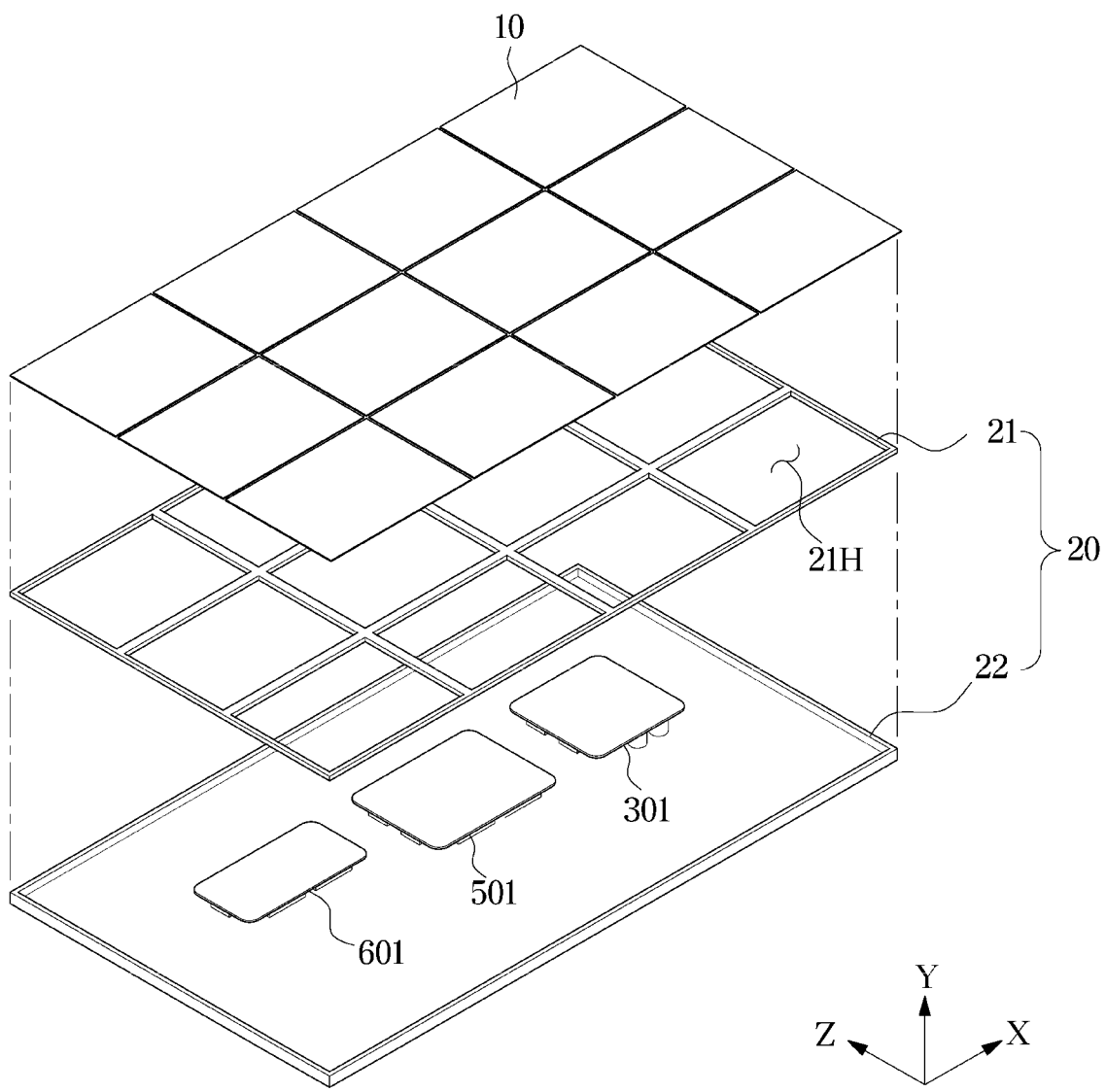
FIG. 18 is a view illustrating an example of a method for coupling a plurality of display modules to a housing in a display apparatus according to an embodiment.

FIG. 18 is a view illustrating an example of a method for coupling the plurality of display modules 10 to a housing in the display apparatus 1 according to an embodiment.

As mentioned above, the plurality of the display module 10 may be arranged in a two-dimensional matrix and fixed on the housing 20. Referring to FIG. 18, the plurality of display modules 10 may be installed in a frame 21 positioned in a lower side thereof, and the frame 21 may have a two-dimensional mesh structure in which a portion of the frame 21 corresponding to the plurality of display modules 10 is opened.

For example, an opening 21H may be formed in the frame 21 in the same number as the number of display modules 10, and the openings 21H may have the same shape or form as that of the plurality of display modules 10.

On the other hand, the plurality of display modules 10 may be mounted on the frame 21 by using a magnetic force by a magnet, by being coupled by a mechanical structure, or by being bonded by an adhesive. There is no limitation on the manner in which the display module 10 is mounted on the frame 21.

The driving board 501, the main board 301, and the power board 601 may be disposed under the frame 21, and may be electrically connected to the plurality of display modules 10 through the opening 21H formed in the frame 21.

A lower cover 22 may be coupled to a lower portion of the frame 21, and the lower cover 22 may form a lower exterior of the display apparatus 1.

In the above example, the case in which the display module 10 is arranged in two dimensions has been described as an example, but is not limited thereto. Therefore, the display module 10 may be arranged in one dimension, and in this case, the structure of the frame 21 may be changed into a one-dimensional mesh structure.

Figure 19:
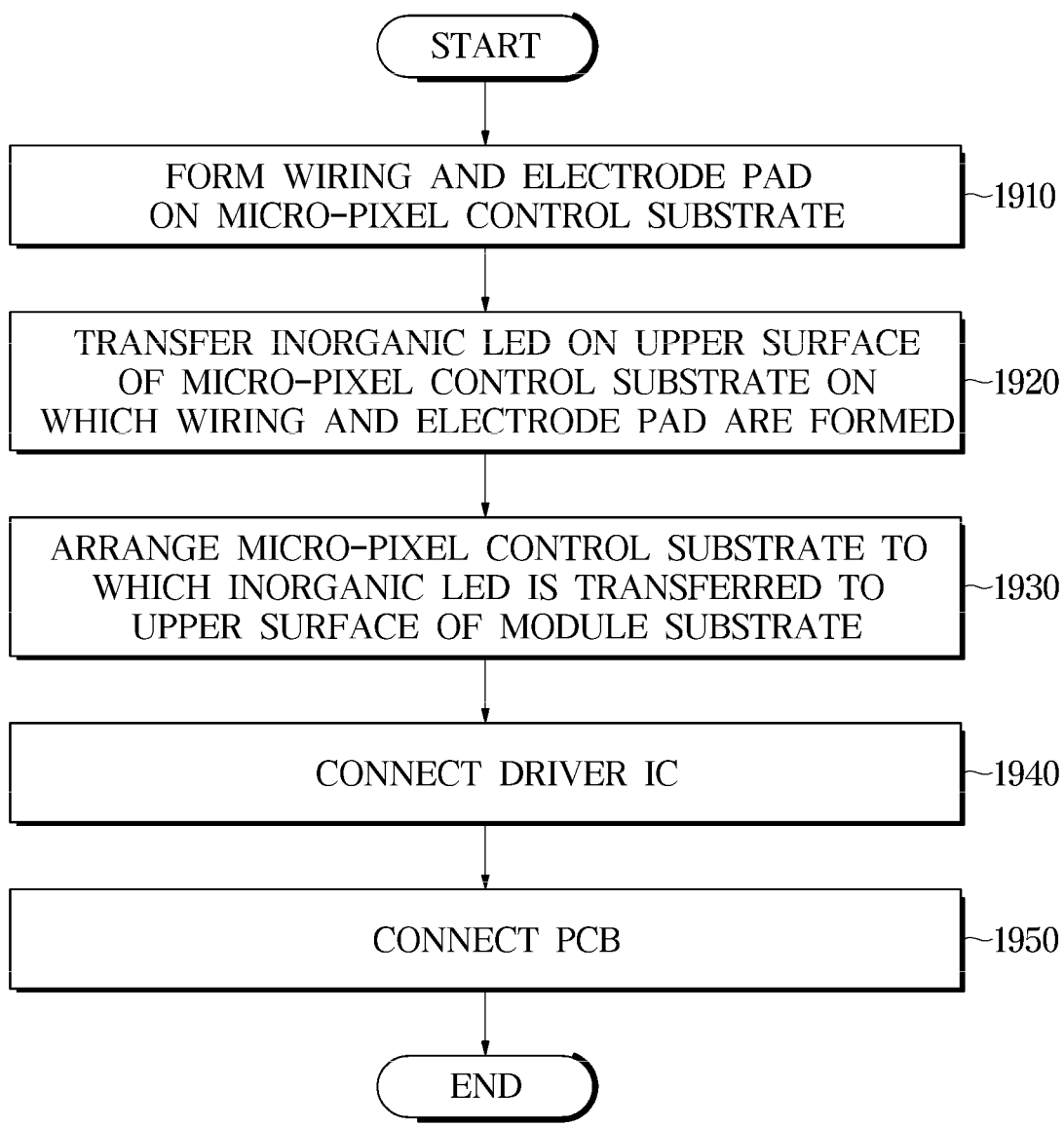
FIG. 19 is a flowchart illustrating a method for manufacturing a display module according to an embodiment.

FIG. 19 is a flow chart illustrating a method for manufacturing the display module according to an embodiment, and FIGS. 20 to 25 are views illustrating the display module manufactured by one or more steps shown in FIG. 19.

Referring to FIG. 19, wiring and electrode pads are formed on a micro-pixel controller substrate (1910).

The micro-pixel controller substrate may refer to the second substrate 132 described above, and wiring and electrode pads may be formed on all of the upper surface, the inner surface, and the lower surface of the second substrate 132. For example, a layer of a metal material such as copper is formed on the upper surface of the second substrate 132, and a photolithography process, which includes processes such as application, exposure, and development of a photosensitive material, and an etching process in which an unnecessary portion is selectively removed, are performed. Therefore, the wiring and electrode pad may be formed on the second substrate 132.

Figure 20:
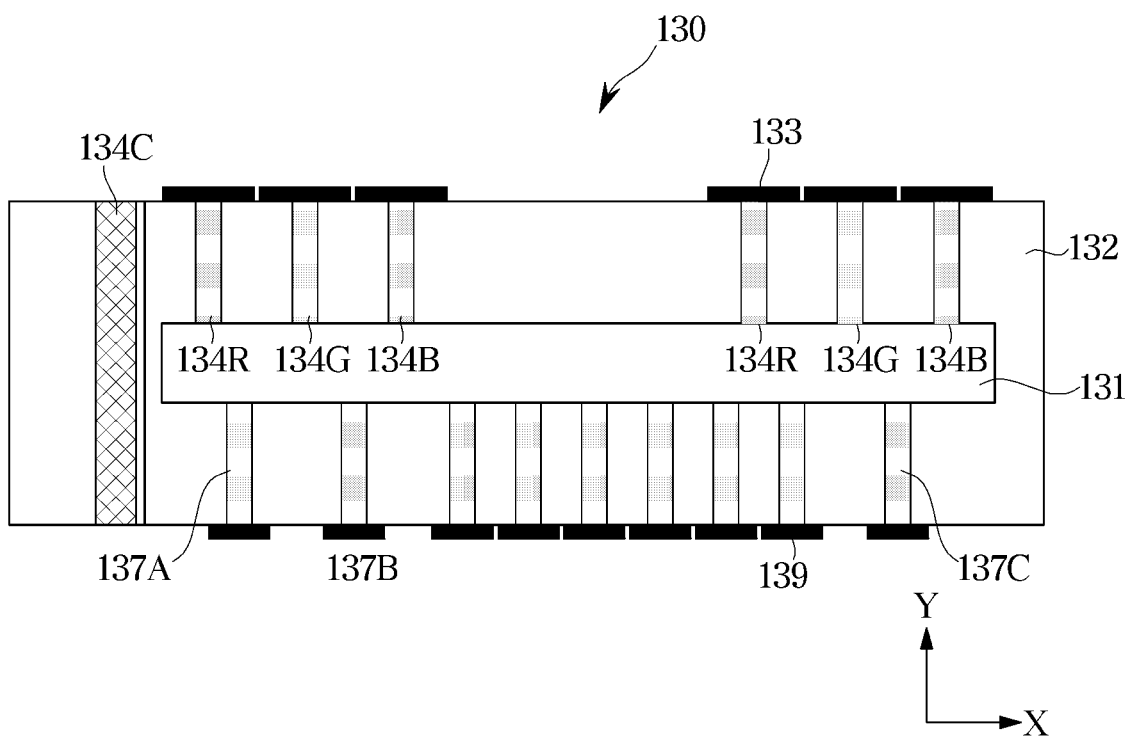
FIGS. 20 to 25 are views illustrating a manufacturing process of a display module according to the steps shown in FIG. 19, according to an embodiment.
Figure 21:
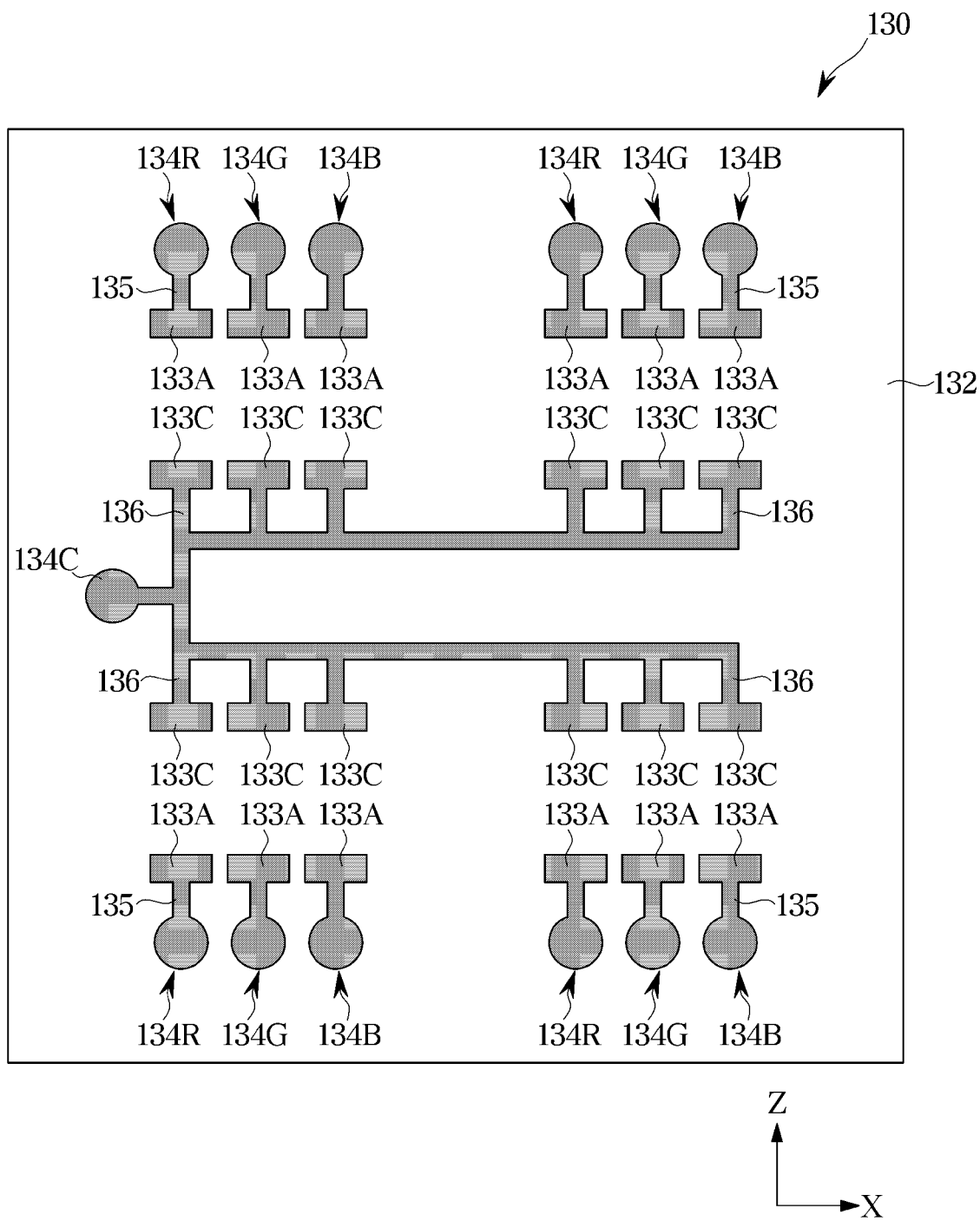

FIG. 20 is a side cross-sectional view of the second substrate 132 on which electrode pads are formed, and FIG. 21 is a view illustrating an upper surface of the second substrate 132 on which wirings and electrode pads are formed.

As illustrated in FIG. 20, through the above-mentioned process, the upper wiring and the upper connection pad 133 may be formed on the upper surface of the second substrate 132 and the lower wiring and the lower connection pad 139 may be formed on the lower surface of the second substrate 132.

Further, the blind via wirings 134R, 134G, and 134B may be formed to electrically connect the upper wiring formed on the upper surface of the second substrate 132 to the pixel circuit 131 disposed in the second substrate 132. The via hole wiring 134C may be formed to electrically connect the upper wiring formed on the upper surface of the second substrate 132 to the first substrate 110. In addition, the blind via wiring 137A, 137B, and 137C may be formed to electrically connect the pixel circuit 131 arranged on the second substrate 132 to the first substrate 110.

For forming the via hole wiring 134C and the blind via wiring 134R, 134G, 134B, 137A, 137B, and 137C, the via hole and the blind via may be formed in the second substrate 132, and inner walls of the via hole and the blind via may be plated with a conductive material such as copper, and then the via hole and the blind via may be filled with a filing material through the VIA filing.

When the structure of the wiring, the electrode pad, the blind via wiring, and the via hole wiring are formed by the above-described process, the anode pad 133A connected to the anode 121 of the plurality of inorganic LEDs 120 and the cathode pad 133C connected to the cathode 122 of the plurality of inorganic LEDs 120 may be arranged on the upper surface of the second substrate 132, as shown in FIG. 21.

The anode pad 133A may be connected to the blind via wirings 134R, 134G, and 134B by the anode wiring 135 among the upper wirings of the second substrate 132. The driving current supplied from the pixel circuit 131 may be supplied to the anode 121 through the via hole wirings 134R, 134G, and 134B connected to the anode wiring 135.

The via hole wiring 134C for applying a common reference voltage $V_{SS}$ to the cathode 122 may be formed in the second substrate 132, and the cathode pad 133C connected to the cathode 122 of the each of the inorganic LEDs 120 may be connected to the via hole wiring 134C by the cathode wiring 136 among the upper wirings of the second substrate 132. The reference voltage $V_{SS}$ supplied from the power board 601 may be supplied to the cathode 122 through the via hole wiring 134C connected to the cathode wiring 136.

Accordingly, the plurality of inorganic LEDs 120 arranged on the upper surface of the second substrate 132 may be electrically connected to the pixel circuit 131 arranged on the second substrate 132 and the first substrate 110 through the upper wiring, the upper connection pad 133, the blind vias 134R, 134G, and 134B, and the via hole wiring 134C.

Referring back to FIG. 19, the inorganic LED 120 is transferred to the upper surface of the micro-pixel controller substrate on which wirings and electrode pads are formed (1920).

The inorganic LED 120 may be a micro-LED. The micro-LED on a wafer or a temporary substrate may be picked up by a transfer mechanism and then transferred to the second substrate 132. In this case, the inorganic LED 120 may be transferred such that the anode 121 and the cathode 122 face the upper surface of the second substrate 132. Any of known techniques such as a method using a laser, a method using a stamp, and a method using a roller may be employed as the transfer method.

In addition, a soldering material or a conductive adhesive may be arranged or applied on the anode pad 133A and the cathode pad 133C formed on the upper surface of the second substrate 132 according to the connection method between the inorganic LED 120 and the upper connection pad 133.

Figure 22:
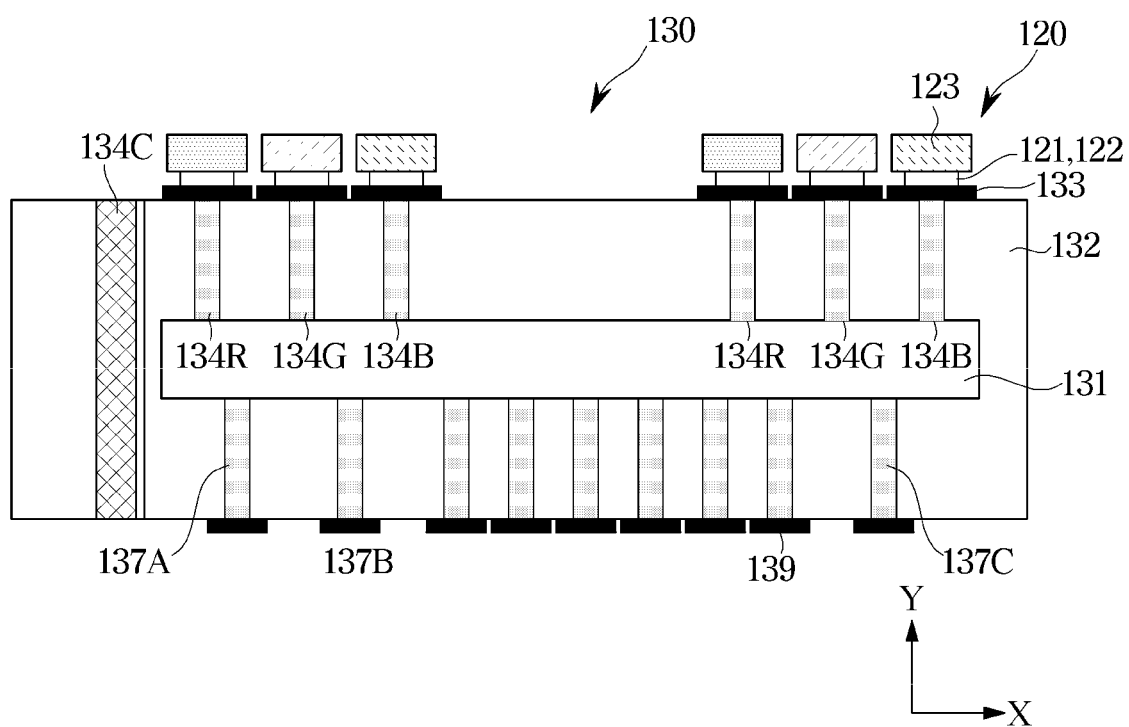

FIG. 22 is a side cross-sectional view of the second substrate 132 to which the inorganic LED 120 is transferred. By transferring the inorganic LED 120 to the upper surface of the second substrate 132 on which a soldering material or a conductive adhesive is disposed or applied, the anode 121 and the anode pad 133A of the inorganic LED 120 may be electrically connected and the cathode 122 and the cathode pad 133C of the inorganic LED 120 may be electrically connected, as shown in FIG. 22.

Referring again to FIG. 19, the micro-pixel controller, to which the inorganic LED 120 is transferred, is disposed on the upper surface of the module substrate (1930).

The module substrate corresponds to the first substrate 110 described above, and the upper wiring for transmitting a driving signal, a power supply voltage $V_{DD}$, and a reference voltage $V_{SS}$ may be disposed on the upper surface of the module substrate. Here, the second substrate 132 of the micro-pixel controller 130 may be disposed on the upper surface of the first substrate 110 and electrically connected to the upper wiring.

The micro-pixel controller 130 may be that the pixel circuit 131 for controlling the inorganic LED 120 is formed on the second substrate 132. The description of the structure and operation of the micro-pixel controller 130 may be the same as the above-mentioned embodiment of the display module 10.

On the other hand, prior to mounting the micro-pixel controller 130 on the first substrate 110, a circuit inspection may be individually performed, and only the micro-pixel controller 130, which is determined to be a faultless product by the circuit inspection, may be mounted on the first substrate 110. For example, a circuit may be determined to be faultless based on satisfying a predetermined error range. Therefore, in comparison with the case of directly mounting the thin film transistor circuit on the module substrate, circuit inspection and replacement of defective products are easy.

Figure 23:
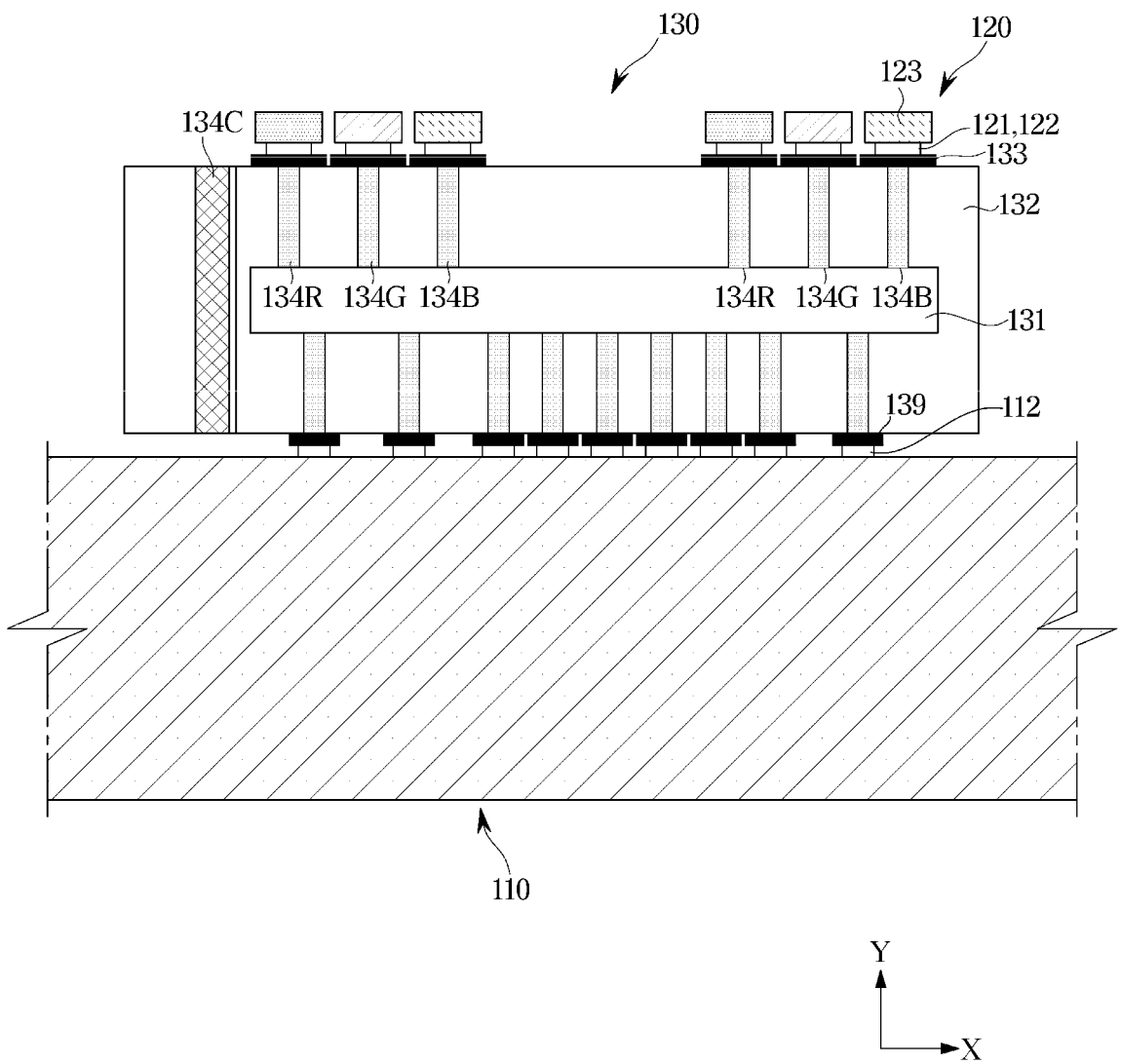

FIG. 23 is a side cross-sectional view of the first substrate 110 on which the micro-pixel controller 130 is arranged. As illustrated in FIG. 23, by electrically connecting the lower connection pad 139 provided on the micro-pixel controller 130 to the upper wiring pad 112 formed on the upper surface of the first substrate 110, the micro-pixel controller 130 may be arranged on the first substrate 110. For example, the lower connection pad 139 and the upper wiring pad 112 may be electrically connected by the soldering or the conductive adhesive.

Referring again to FIG. 19, the driver IC is connected to the module board (1940).

The driver IC 200 may be electrically connected to the first substrate 110 by applying one of various bonding methods such as Chip on Film (COF) or Film on Glass (FOG) bonding, Chip on Glass (COG) bonding, Tape Automated Bonding (TAB), etc.

Figure 24:
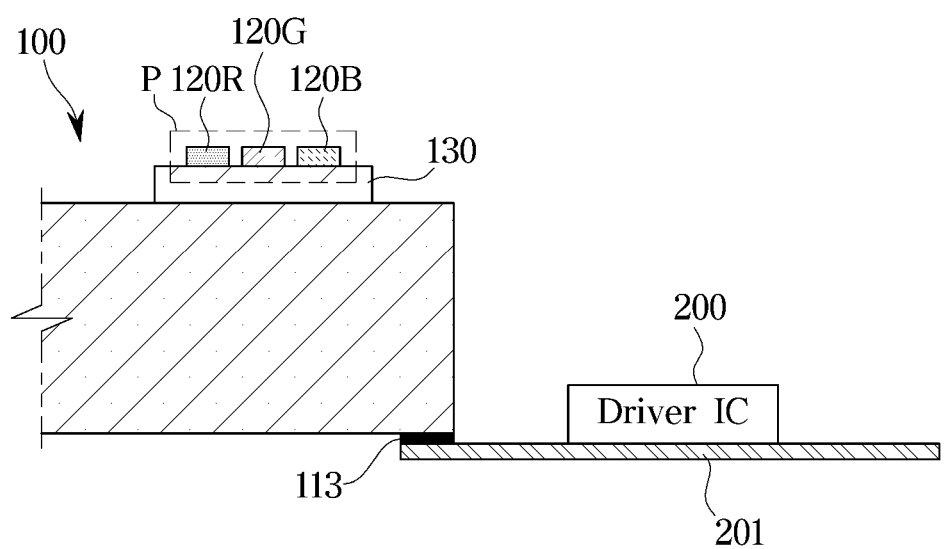

FIG. 24 is a side cross-sectional view of the first substrate 110 to which the driver IC 200 is connected. As an example, when COF bonding is used, the driver IC 200 may be mounted on the film 201, and one end of the film 201 on which the driver IC 200 is mounted may be electrically connected to the substrate 110, as shown in FIG. 24.

For example, one end of the film 201, on which the driver IC 200 is mounted, may be electrically connected to the lower wiring pad 113 provided on the lower surface of the first substrate 110, and the lower electrode pad 113 electrically connected to the film 201, on which the driver IC 200 is mounted, may be connected to the upper wiring, on which the micro-pixel controller 130 is disposed, through the via-hole wiring or the side wiring. The micro-pixel controller 130 may receive a gate signal and a data signal from the driver IC 200 through a corresponding upper wiring.

Referring back to FIG. 19, the FPCB is connected to the module substrate (1950).

Figure 25:
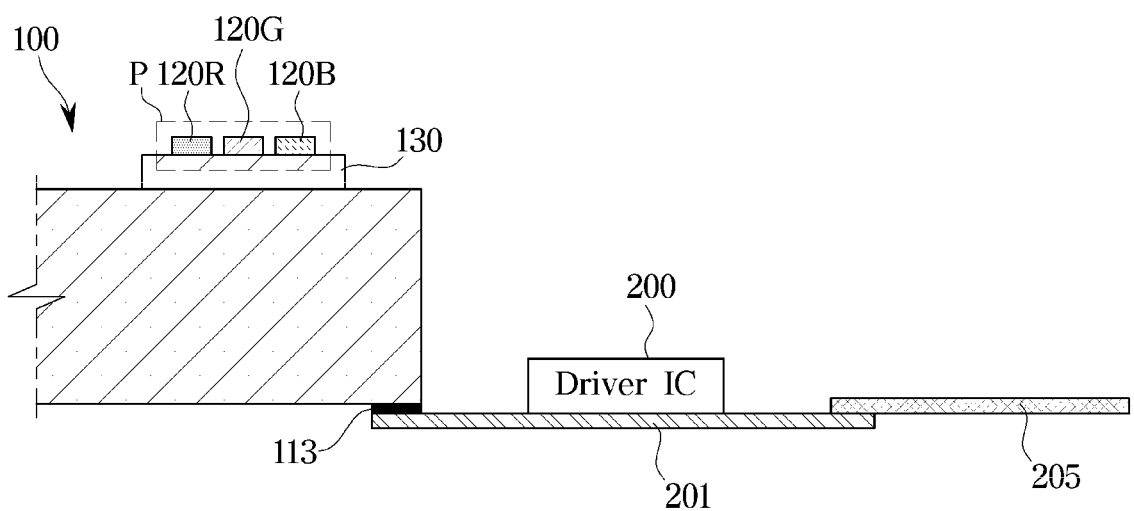

FIG. 25 is a side cross-sectional view of the first substrate 110 to which the FPCB 205 is connected. As mentioned above, when COF bonding is used, the other end of the film 201, on which the driver IC 200 is mounted may be electrically connected to the FPCB 205, as shown in FIG. 25.

The FPCB 205 connected to the film 201, on which the driver IC 200 is mounted, may be electrically connected to the driving board 501 to transmit a timing control signals and image data output from the driving board 501 to the driver IC 200.

In addition, the first substrate 110 may be connected to a FPCB for receiving power, and the FPCB for supplying power may be electrically connected to the power board 601 to supply a power supply voltage $V_{DD}$ or a reference voltage $V_{SS}$ to the micro-pixel controller 130 or the inorganic LED 120.

The method of manufacturing the display module according to the one or more embodiments may include not only all of the above-described processes, but may also include only some processes. Alternatively, additional processes may be further added.

The one or more embodiments of the disclosure may be embodied in the form of a recording medium storing instructions executable by a computer. The instructions may be stored in the form of program code and, when executed by a processor, may generate a program module to perform the operations of the one or more embodiments. The recording medium may be embodied as a non-transitory computer-readable recording medium.

The computer-readable recording medium includes all kinds of recording media in which instructions which can be decoded by a computer are stored. For example, there may be a Read Only Memory (ROM), a Random Access Memory (RAM), a magnetic tape, a magnetic disk, a flash memory, and an optical data storage device While the present disclosure has been particularly described with reference to some embodiments, it should be understood by those of skilled in the art that various changes in form and details may be made without departing from the spirit and scope of the present disclosure.

What is claimed is:

1. A display module comprising:
a first substrate;
a plurality of micro-pixel controllers provided on an upper surface of the first substrate and comprising a second substrate;
a plurality of pixels comprising a plurality of inorganic light emitting diodes (LEDs) provided on an upper surface of the second substrate; and
a driver integrated chip (IC) configured to transmit a driving signal to the plurality of micro-pixel controllers,
wherein each pixel of the plurality of pixels comprises at least two inorganic LEDs among the plurality of inorganic LEDs, and wherein each micro-pixel controller of the plurality of micro-pixel controllers is electrically connected to inorganic LEDs of at least two pixels among the plurality of pixels,
wherein each micro-pixel controller of the plurality of micro-pixel controllers comprises:
an upper connection pad provided on the upper surface of the second substrate and electrically connected to an inorganic LED of the inorganic LEDs,
a pixel circuit provided in the second substrate and electrically connected to the upper connection pad through a first blind via extending from the pixel circuit to the upper surface of the second substrate in a vertically upward direction, and
a plurality of lower connection pads provided on a lower surface of the second substrate and electrically connected to the pixel circuit through a plurality of second blind vias, respectively, and
wherein each of the plurality of second blind vias extends from the pixel circuit to the lower surface of the second substrate in a vertically downward direction opposite to the vertically upward direction and is electrically connected to an upper wiring pad of the first substrate,
wherein the upper connection pad comprises a cathode pad electrically connected to a cathode of the inorganic LED, and
the cathode pad is electrically connected to a lower connection pad provided on the lower surface of the second substrate through a via hole extending from the upper surface of the second substrate to the lower surface of the second substrate in the vertically downward direction, and is supplied with a reference voltage through the first substrate.

2. The display module of claim 1, wherein each micro-pixel controller of the plurality of micro-pixel controllers is configured to switch the inorganic LEDs of the at least two pixels, and supply a driving current to the inorganic LEDs of the at least two pixels.

3. The display module of claim 1, wherein the first substrate comprises an upper wiring that is connected to the driver IC to transmit the driving signal.

4. The display module of claim 3, wherein each micro-pixel controller of the plurality of micro-pixel controllers is electrically connected to the upper wiring through the upper wiring pad, and configured to receive the driving signal output from the driver IC through the upper wiring.

5. The display module of claim 1, wherein pixels adjacent to each other among the plurality of pixels are spaced apart from each other at a predetermined interval.

6. The display module of claim 5, wherein an interval between two or more pixels arranged on a first micro-pixel controller among the plurality of micro-pixel controllers is equal to an interval between a first pixel arranged on the first micro-pixel controller and a second pixel adjacent to the first pixel and arranged on a second micro-pixel controller adjacent to the first micro-pixel controller among the plurality of micro-pixel controllers.

7. The display module of claim 1, wherein the second substrate comprises a silicon substrate.

8. The display module of claim 1, wherein each pixel of the plurality of pixels comprises at least three sub-pixels that output light of different colors.

9. The display module of claim 1, wherein the plurality of second blind vias comprise a blind via for a gate signal of the pixel circuit, a blind via for a data signal of the pixel circuit, and a blind via for a power supply of the pixel circuit.

10. A display apparatus comprising:
a plurality of display modules; and
a frame configured to support the plurality of display modules,
wherein each display module of the plurality of display modules comprises:
a first substrate;
a plurality of micro-pixel controllers arranged on an upper surface of the first substrate and comprising a second substrate;
a plurality of pixels arranged in two dimensions and comprising a plurality of inorganic light emitting diodes (LEDs) arranged on an upper surface of the second substrate; and
a driver integrated chip (IC) configured to transmit a driving signal to the plurality of micro-pixel controllers,
wherein each pixel of the plurality of pixels comprises at least two LEDs among the plurality of inorganic LEDs,
wherein each micro-pixel controller of the plurality of micro-pixel controllers is electrically connected to inorganic LEDs of at least two pixels among the plurality of pixels,
wherein each micro-pixel controller of the plurality of micro-pixel controllers comprises:
  an upper connection pad provided on the upper surface of the second substrate and electrically connected to an inorganic LED of the inorganic LEDs,
  a pixel circuit provided in the second substrate and electrically connected to the upper connection pad through a first blind via extending from the pixel circuit to the upper surface of the second substrate in a vertically upward direction, and
  a plurality of lower connection pads provided on a lower surface of the second substrate and electrically connected to the pixel circuit through a plurality of second blind vias, respectively, and
wherein each of the plurality of second blind vias extends from the pixel circuit to the lower surface of the second substrate in a vertically downward direction opposite to the vertically upward direction and electrically connected to an upper wiring pad of the first substrate, and
wherein the upper connection pad comprises a cathode pad electrically connected to a cathode of the inorganic LED, and
the cathode pad is electrically connected to a lower connection pad provided on the lower surface of the second substrate through a via hole extending from the upper surface of the second substrate to the lower surface of the second substrate in the vertically downward direction, and is supplied with a reference voltage through the first substrate.

11. The display apparatus of claim 10, wherein each micro-pixel controller of the plurality of micro-pixel controllers is configured to switch the inorganic LEDs of the at least two pixels, and supply a driving current to the inorganic LEDs of the at least two pixels.

12. The display apparatus of claim 10, wherein the first substrate comprises an upper wiring that is connected to the driver IC to transmit the driving signal.

13. The display apparatus of claim 10, wherein the plurality of second blind vias comprise a blind via for a gate signal of the pixel circuit, a blind via for a data signal of the pixel circuit, and a blind via for a power supply of the pixel circuit.

* * * * *